(12) United States Patent
Jang et al.

(10) Patent No.: US 12,501,796 B2
(45) Date of Patent: Dec. 16, 2025

(54) DISPLAY DEVICE

(71) Applicant: Samsung Display Co., LTD., Yongin-si (KR)

(72) Inventors: Jae Yong Jang, Yongin-si (KR); Dan Won Lim, Yongin-si (KR); Bon Yong Koo, Yongin-si (KR); Su Jin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 521 days.

(21) Appl. No.: 18/153,285

(22) Filed: Jan. 11, 2023

(65) Prior Publication Data

US 2023/0413621 A1    Dec. 21, 2023

(30) Foreign Application Priority Data

May 19, 2022    (KR) .................. 10-2022-0061157

(51) Int. Cl.
*H10K 59/131* (2023.01)
*H05K 5/02* (2006.01)
*H10K 102/00* (2023.01)

(52) U.S. Cl.
CPC ......... *H10K 59/131* (2023.02); *H05K 5/0217* (2013.01); *H10K 2102/311* (2023.02)

(58) Field of Classification Search
None
See application file for complete search history.

(56) References Cited

U.S. PATENT DOCUMENTS

2023/0222959 A1*  7/2023  Kim .................. G06F 1/16
                                                  345/428

FOREIGN PATENT DOCUMENTS

| KR | 10-2012-0057712 A | 6/2012 |
| KR | 10-2017-0026747 A | 3/2017 |
| KR | 10-2017-0065713 A | 6/2017 |
| KR | 10-2019-0080281 A | 7/2019 |

\* cited by examiner

*Primary Examiner* — Kyoung Lee
(74) *Attorney, Agent, or Firm* — Womble Bond Dickinson (US) LLP

(57) ABSTRACT

A display device includes: a display panel including an active area to be slid in a first direction and a non-active area surrounding the active area; a plurality of pixels in the active area; and a first power supply to transfer a first power voltage to drive the plurality of pixels, wherein the active area includes: a first active area; and a second active area on one side of the first active area in the first direction and configured to be slid in the first direction, the first power supply includes: a first voltage bar on one side of the first active area in the non-active area in a second direction crossing the first direction; a second voltage bar spaced apart from one end of the first voltage bar in the first direction and on one side of the second active area in the non-active area in the second direction.

25 Claims, 16 Drawing Sheets

PNL: AA, NAA, SBA
AA: AA_1, AA_2, AA_3
NAA: DM, BZ
SP: SG, MPL
BZ: BZa, BZb
BZa: BZa_1, BZa_2, BZa_3
BZb: BZb_1, BZb_2, BZb_3
DM: DM_1, DM_2

DISPLAY DEVICE

CROSS-REFERENCE TO RELATED APPLICATION

The present application claims priority to and the benefit of Korean Patent Application No. 10-2022-0061157 filed on May 19, 2022 in the Korean Intellectual Property Office, the entire content of which is incorporated herein by reference.

BACKGROUND

1. Field

Aspects of some embodiments of the present disclosure relate to a display device.

2. Description of the Related Art

With the advancement of multimedia, the importance of display devices in modern society has increased. Accordingly, various types of display devices such as organic light emitting diode display (OLED) devices and liquid crystal display (LCD) devices have been used.

A display device is a device for displaying image, and includes a display panel such as an organic light emitting display panel or a liquid crystal display panel. The display device may include a light emitting element as a light emitting display panel, and for example, a light emitting diode (LED) may include an organic light emitting diode (OLED) using an organic material as a fluorescent material and an inorganic light emitting diode using an inorganic material as a fluorescent material.

Recently, with the development of display technology, research and development on display devices having a flexible display is actively ongoing. The flexible display may extend or reduce a display screen by folding, bending or sliding the display screen, thereby significantly contributing to decrease in volume or change in design of the display device.

The above information disclosed in this Background section is only for enhancement of understanding of the background and therefore the information discussed in this Background section does not necessarily constitute prior art.

SUMMARY

Aspects of some embodiments include a display device in which lighting of a pixel is uniform depending on an area.

The characteristics of embodiments according to the present disclosure are not limited to those mentioned above and additional characteristics of the disclosure, which are not mentioned herein, will be more clearly understood by those skilled in the art from the following description of the disclosure.

According to some embodiments, a display device comprises, a display panel including an active area slid in a first direction and a non-active area surrounding the active area; a plurality of pixels in the active area; and a first power supply transferring a first power voltage for driving the plurality of pixels, wherein the active area includes: a first active area; and a second active area on one side of the first active area in the first direction and slid in the first direction, the first power supply includes: a first voltage bar on one side of the first active area in the non-active area in a second direction crossing the first direction; a second voltage bar spaced apart from one end of the first voltage bar in the first direction and on one side of the second active area in the non-active area in the second direction.

According to some embodiments, the display panel further includes a sub-area protruded from the non-active area to one side in the second direction, overlapped with the first active area in the second direction and non-overlapped with the second active area in the second direction, and the first power supply further includes a first power lead-in portion in the sub-area to apply the first power voltage to the first voltage bar and the second voltage bar.

According to some embodiments, the first power supply includes: a first bridge part protruded from the other side of the first voltage bar in the first direction toward the first active area; a second bridge part protruded from one side of the first voltage bar in the first direction toward the first active area and spaced apart from the first bridge part; and a third bridge part protruded from the second voltage bar toward the second active area and spaced apart from the second bridge part.

According to some embodiments, a width of a gap space between the second bridge part and the third bridge part is greater than a width of a gap space between the first voltage bar and the second voltage bar.

According to some embodiments, the first power lead-in portion includes: a first lead-in portion electrically connected to the first voltage bar; and a second lead-in portion electrically connected to the first voltage bar and spaced apart from the first lead-in portion, and a width of a gap space between the first bridge part and the second bridge part is greater than a width of a gap space between the first inlet portion and the second lead-in portion.

According to some embodiments, the first lead-in portion is closer to the first bridge part than the second bridge part, and the second lead-in portion is closer to the second bridge part than the first bridge part.

According to some embodiments, each of the first bridge part, the second bridge part and the third bridge part includes a plurality of bridges, and the plurality of bridges are respectively extended in the second direction, and are spaced apart from each other in the first direction.

According to some embodiments, the first power supply further includes: a plurality of first power voltage lines extended in the second direction within the active area and spaced apart from each other in the first direction; and a mesh portion at the first bridge part, the second bridge part, and the third bridge part and the plurality of first power voltage lines to have a grid pattern, and the mesh portion electrically connects the first bridge part, the second bridge part and the third bridge part and the plurality of first power voltage lines.

According to some embodiments, each of the plurality of first power voltage lines is electrically connected to each of the plurality of pixels.

According to some embodiments, a display device may further comprise a second power supply spaced apart from the first power supply and extended from the non-active area along an edge of the active area, transferring a second power voltage for driving the plurality of pixels, wherein the first power voltage has a potential greater than that of the second power voltage.

According to some embodiments, the active area further includes a third active area on the other side of the first active area in the first direction and slid in the first direction, and the first power supply further includes a third voltage bar spaced apart from the other end of the first voltage bar in the first direction and on one side of the third active area in the non-active area in the second direction.

According to some embodiments, the first power supply further includes a first conducting portion in a gap space between the first voltage bar and the second voltage bar to electrically connect the first voltage bar with the second voltage bar, and electrical resistance of the first conducting portion is greater than electrical resistance of the first voltage bar and electrical resistance of the second voltage bar.

According to some embodiments, a thickness of the first conducting portion is smaller than a thickness of the first voltage bar and a thickness of the second voltage bar.

According to some embodiments of the present disclosure, a display device comprise, a display panel including an active area slid in a first direction and a non-active area surrounding the active area; a plurality of pixels in the active area; and a first power supply transferring a first power voltage for driving the plurality of pixels, the active area includes: a first active area; a second active area on one side of the first active area in the first direction and slid in the first direction, the first power supply includes: a voltage bar on one side of the active area in the non-active area in a second direction crossing the first direction and overlapped with the first active area and the second active area in the second direction as a single body extended in the first direction; and a first bridge part and a second bridge part, which are protruded from the voltage bar in the second direction and spaced apart from each other in the first direction, and a gap space between the first bridge part and the second bridge part overlaps the first active area in the second direction.

According to some embodiments, the display panel further includes a sub-area protruded from the non-active area to one side in the second direction, overlapped with the first active area in the second direction and non-overlapped with the second active area in the second direction, and the first power supply further includes a first power lead-in portion in the sub-area to apply the first power voltage to the voltage bar.

According to some embodiments, the first bridge part overlaps the first active area and the second active area in the second direction, and the second bridge part overlaps the first active area in the second direction and does not overlap the second active area in the second direction.

According to some embodiments, each of the first bridge part and the second bridge part includes a plurality of bridges, and the plurality of bridges are extended in the second direction and are spaced apart from each other in the first direction.

According to some embodiments, the first power lead-in portion includes a first lead-in portion, a second lead-in portion, a third lead-in portion, and a fourth lead-in portion, which are spaced apart from one another, the first lead-in portion and the second lead-in portion overlap the gap space between the first bridge part and the second bridge part in the second direction, the third lead-in portion overlaps the first bridge part in the second direction, and the fourth lead-in portion overlaps the second bridge part in the second direction.

According to some embodiments, a display device may further comprise a first driving chip and a second driving chip, which generate a data signal for driving the plurality of pixels, the first driving chip and the second driving chip are spaced apart from each other in the sub-area, the first driving chip is in a gap space between the first lead-in portion and the fourth lead-in portion, and the second driving chip is in a gap space between the second lead-in portion and the third lead-in portion.

According to some embodiments, a display device may further comprise a panel support on the other surface facing one surface of the display panel to support the display panel, wherein the plurality of pixels and the first power supply are on one surface of the display panel.

According to some embodiments, the active area further includes a third active area on the other side of the first active area in the first direction and slid in the first direction, non-overlapped with the sub-area in the second direction and overlapped with the second bridge part in the second direction, the panel support includes: a plate overlapped with the first active area; and a plurality of segments non-overlapped with the first active area and overlapped with the second active area and the third active area, and the plurality of segments are respectively extended in the second direction, and are spaced apart from each other in the first direction.

According to some embodiments, a thickness of the plate is smaller than that of each of the plurality of segments, and an air gap is on a bottom surface of the plate.

According to some embodiments of the disclosure a display panel comprise an active area including a first active area, a second active area on one side of the first active area in a first direction and slid in the first direction, and a third active area on the other side of the first active area in the first direction and slid in the first direction; a non-active area surrounding the active area; and a power supply on one side of the active area on the non-active area in a second direction crossing the first direction, the power supply includes: a voltage bar extended in the first direction; and a first bridge part and a second bridge part, which are protruded from the voltage bar in the second direction and spaced apart from each other in the first direction, and a gap space between the first bridge part and the second bridge part overlaps the first active area in the second direction.

According to some embodiments, the voltage bar includes: a first voltage bar on one side of the first active area in the second direction; a second voltage bar spaced apart from one end of the first voltage bar in the first direction and on one side of the second active area in the second direction; and a third voltage bar spaced apart from the other end of the first voltage bar in the first direction and on one side of the third active area in the second direction.

According to some embodiments, the voltage bar overlaps the first to third active areas in the second direction as a single body extended in the first direction.

In the display device according to some embodiments, lighting of a pixel may be relatively uniform depending on an area.

The effects according to the embodiments according to the present disclosure are not limited to those mentioned above and more various effects are included in the following description of the disclosure.

BRIEF DESCRIPTION OF THE DRAWINGS

The above and other aspects and features of the disclosure will become more apparent by describing in more detail aspects of some embodiments thereof with reference to the attached drawings, in which.

DETAILED DESCRIPTION

Aspects of some embodiments of the present invention will now be described more fully hereinafter with reference to the accompanying drawings, in which some embodiments of the invention are shown. Embodiments according to the present invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Features of various embodiments of the disclosure may be partially or overall coupled to or combined with each other and may be variously inter-operated with each other and driven technically as those skilled in the art can sufficiently understand. The embodiments of the disclosure may be carried out independently from each other or may be carried out together in co-dependent relationship.

Hereinafter, further details of some embodiments of the disclosure will be described with reference to the accompanying drawings.

Figure 1:
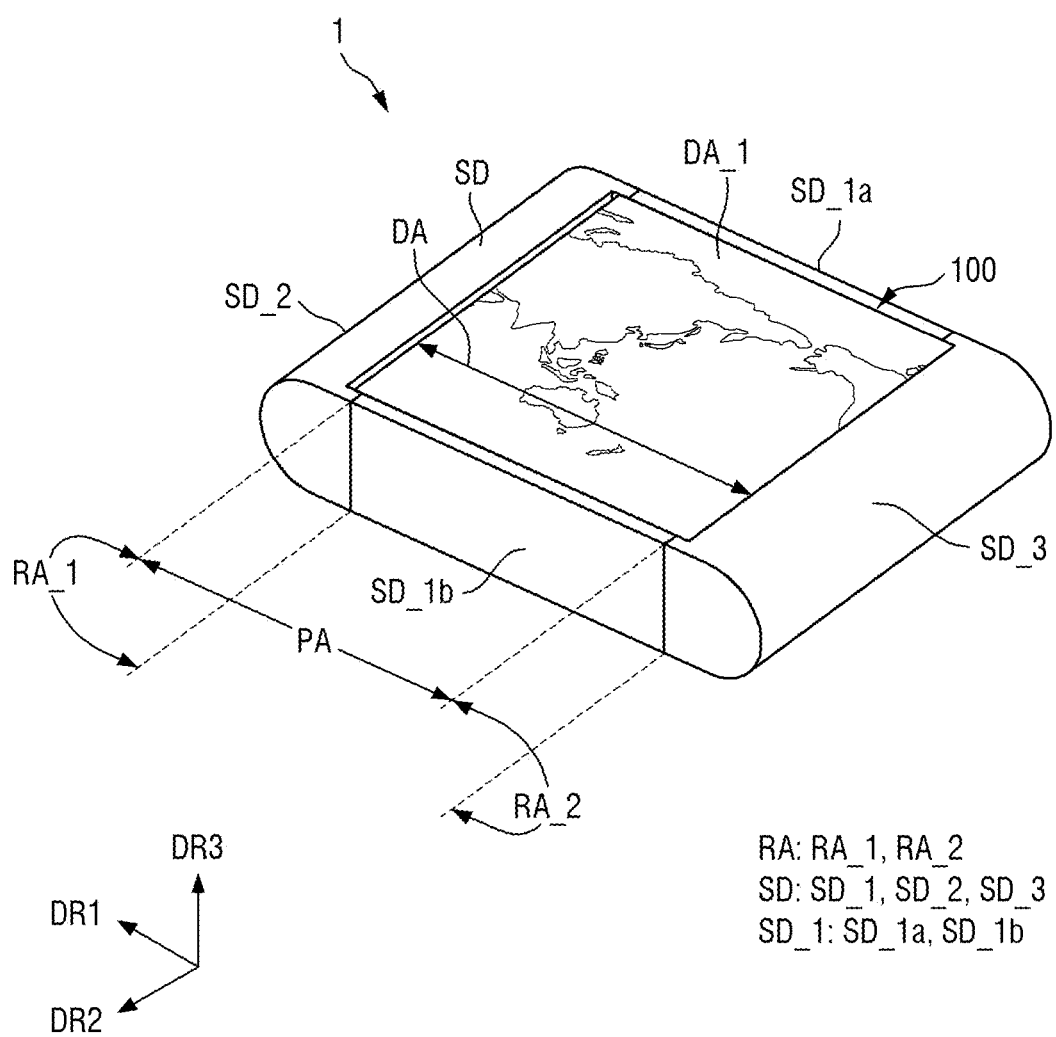
FIG. 1 is a perspective view illustrating a display device according to some embodiments.
Figure 2:
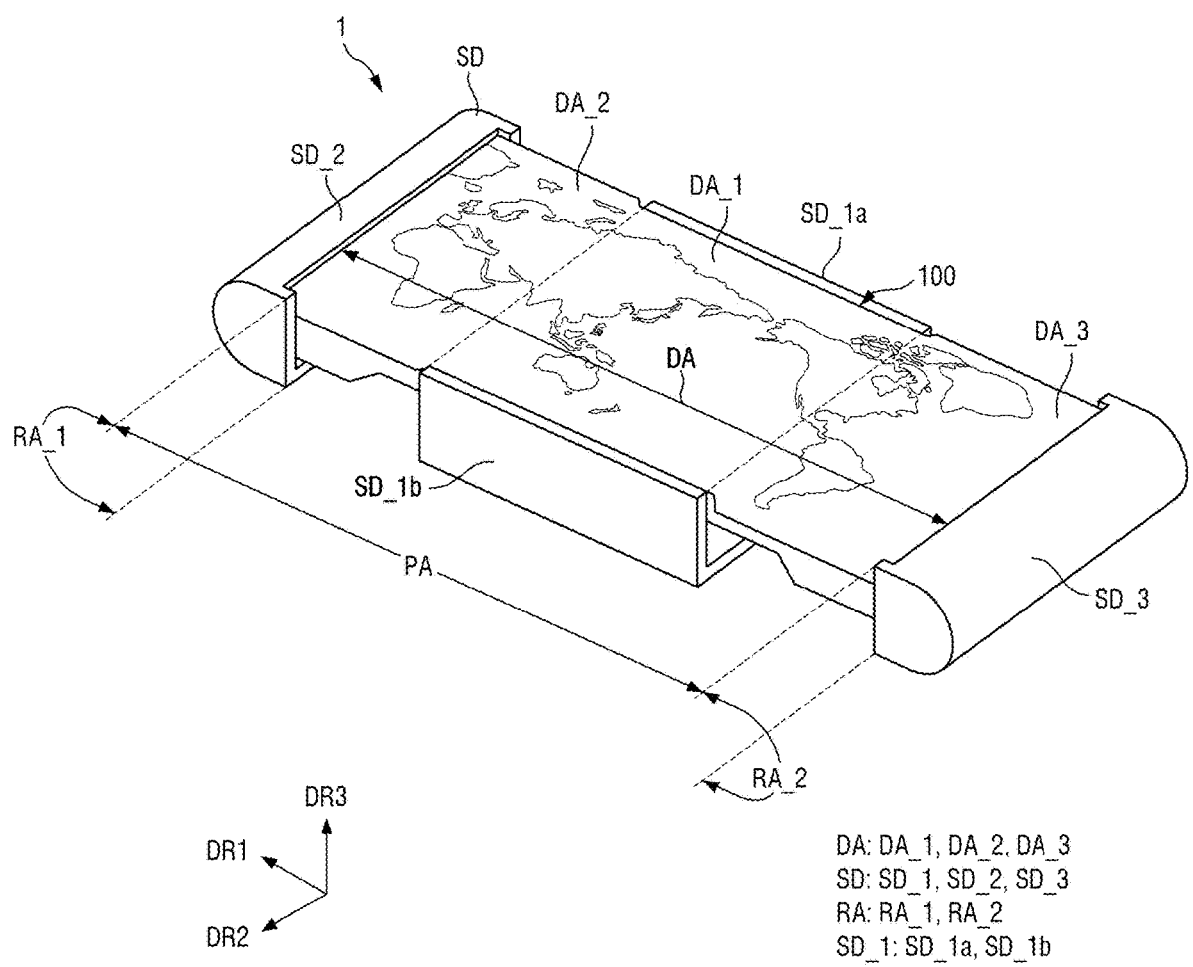
FIG. 2 is a perspective view illustrating a state that a display device is expanded according to some embodiments.
Figure 3:
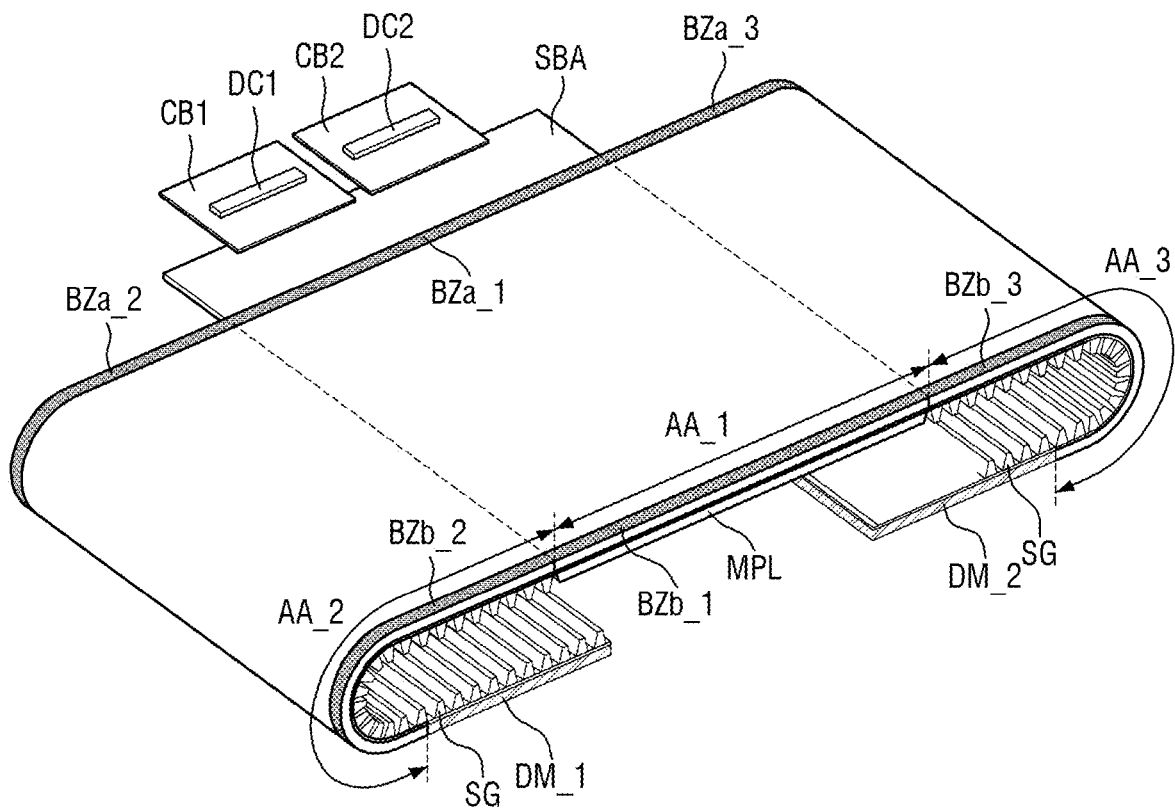
FIG. 3 is a perspective view illustrating a display panel and a display panel support of a display device according to some embodiments.
Figure 3:
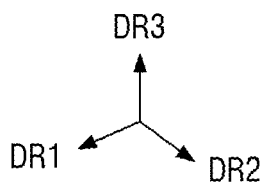
Figure 4:
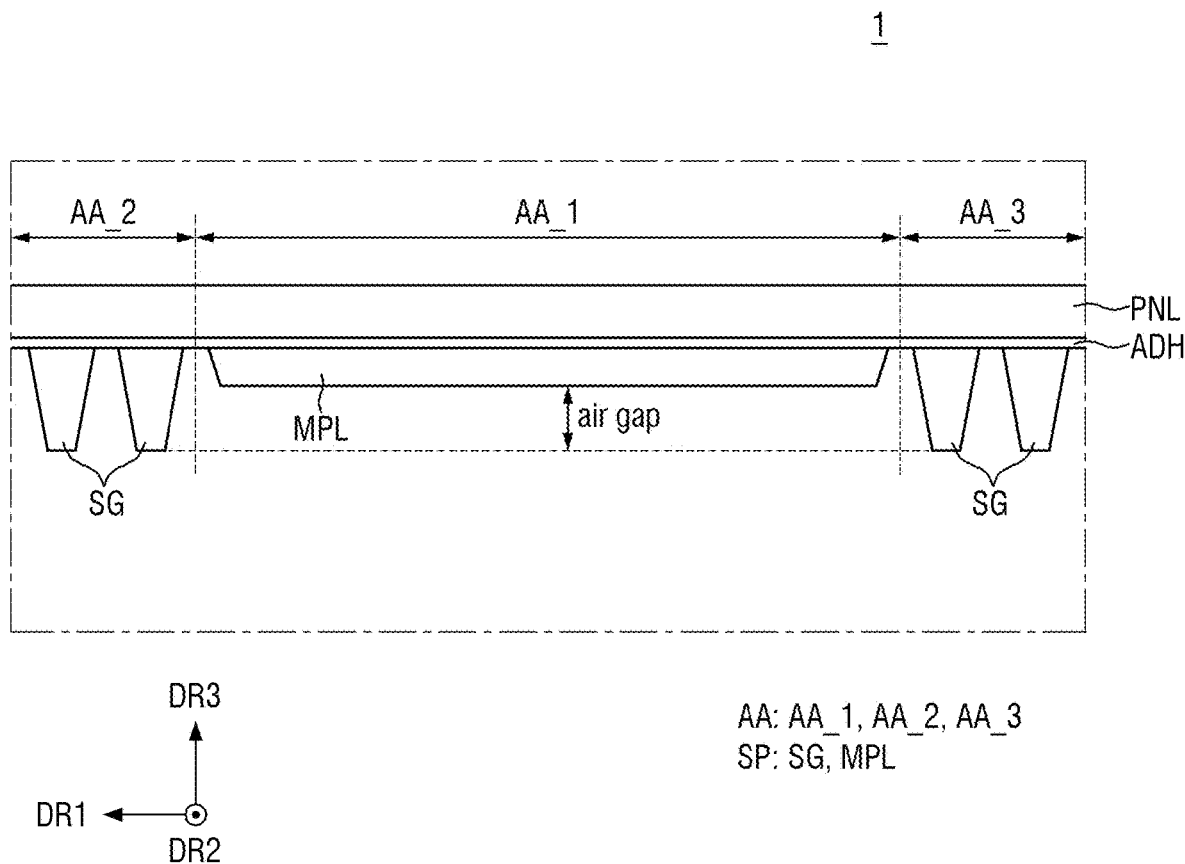
FIG. 4 is a structural view illustrating an arrangement relation of a display panel and a display panel support of a display device according to some embodiments.
Figure 5:
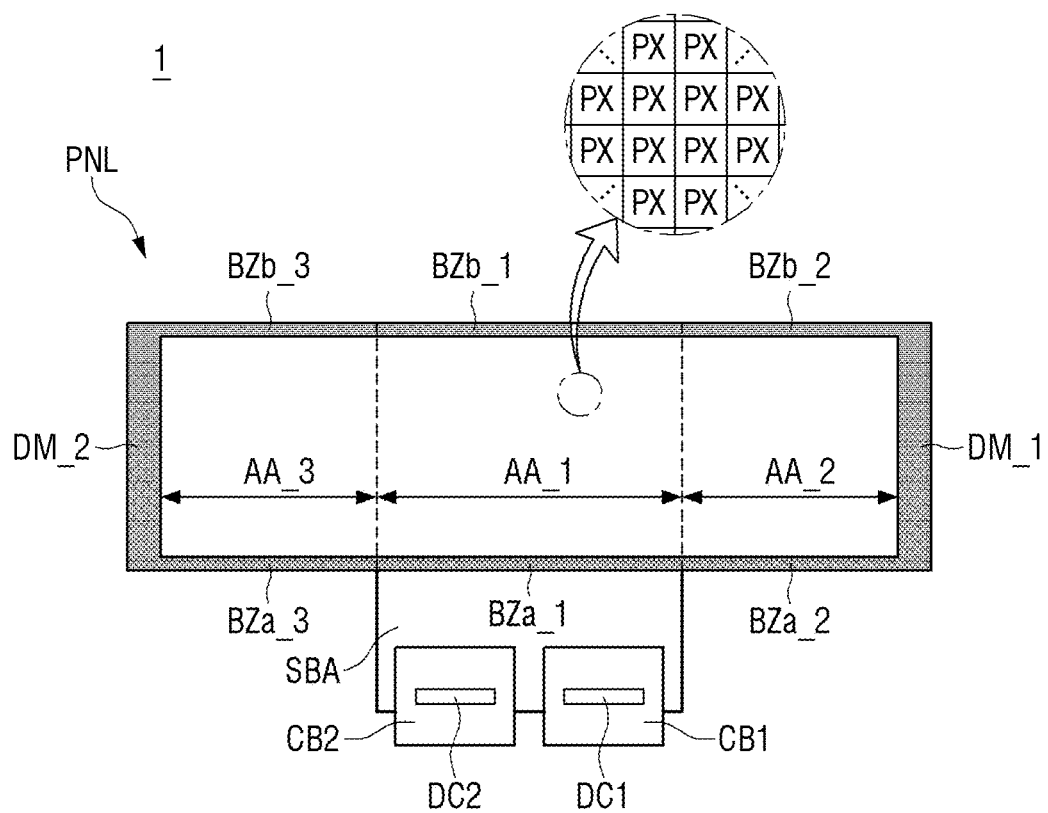
FIG. 5 is a plan view illustrating a display panel of a display device according to some embodiments.

FIG. 1 is a perspective view illustrating a display device according to some embodiments. FIG. 2 is a perspective view illustrating a state that a display device is extended according to some embodiments. FIG. 3 is a perspective view illustrating a display panel ad a display panel support of a display device according to some embodiments. FIG. 4 is a structural view illustrating an arrangement relation of a display panel and a display panel support of a display device according to some embodiments. FIG. 5 is a plan view illustrating a display panel of a display device according to some embodiments.

In FIG. 1, a first direction DR1, a second direction DR2 and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It is to be understood that the first direction DR1 denotes a horizontal direction on the drawing, the second direction DR2 denotes a vertical direction on the drawing, and the third direction DR3 denotes upper and lower directions on the drawing. In the description below, unless otherwise specified, "direction" may refer to both directions that are directed toward both sides extended along the direction. In addition, when it is necessary to distinguish both "directions" extended to both sides, one side will be referred to as "one side direction" and the other side will be referred to as "the other side direction". Based on FIG. 1, a direction in which an arrow is directed will be referred to as one side, and its opposite direction will be referred to as the other side.

Hereinafter, for convenience of description, when referring to the display device 1 or surfaces of each member constituting the display device 1, one surface facing one side of a direction in which an image is displayed, that is, a third direction DR3, is referred to as an upper surface, and an opposite surface of the one surface is referred to as a bottom surface, but embodiments according to the present disclosure are not limited thereto. The one surface and the other surface of the member may be referred to as a front surface and a rear surface, respectively, or may be referred to as a first surface or a second surface. Further, in describing the relative position of each member of the display device 1, one side in the third direction DR3 may be referred to as an upper portion, and the other side in the third direction DR3 may be referred to as a lower portion.

Referring to FIGS. 1 and 2, the display device 1 according to some embodiments may be a sliding display device or a slidable display device, which is capable of sliding in the first direction DR1. The display device 1 according to some embodiments may be a multi-slidable display device that slides in both directions, i.e., both sides in the first direction DR1, but embodiments according to the present disclosure are not limited thereto. For example, the display device 1 may be a single slidable display device that slides only in one direction, i.e., only one side in the first direction DR1 or the other side in the first direction DR1. Hereinafter, the description will be based on that the display device 1 according to some embodiments is a multi-slidable display device.

The display device 1 may include a display device flat area PA and a display device bending area RA. The display device flat area PA of the display device 1 overlaps an area that exposes a display panel PNL of a panel accommodating container SD, which will be described in more detail later. The display device bending area RA of the display device 1 may be formed inside the panel accommodating container SD. The display device bending area RA may be an area that is bent with a radius (e.g., a set or predetermined radius) of curvature and the display panel PNL is bent depending on the radius of curvature. The display device bending area RA may be located on both sides of the display device flat area PA in the first direction DR1. That is, a first display device bending area RA_1 may be located on the other side of the display device flat area PA in the first direction DR1, and a second display device bending area RA_2 may be located on the one side of the display device flat area PA in the first direction DR1. The first display device bending area RA_1 may be an area in which a second active area AA_2 of the display panel PNL, which will be described later, is bent. The second display device bending area RA_2 may be an area in which a third active area AA_3 of the display panel, which will be described in more detail later, is bent. Meanwhile, as the display device 1 is expanded, a size of the display device flat area PA may be increased as shown in FIG. 2. Therefore, a distance between the first display device bending area RA_1 and the second display device bending area RA_2 may be increased.

Referring to FIGS. 1 to 5, the display device according to some embodiments may include a display panel PNL, a panel support, and a panel accommodating container SD.

The display panel PNL is a panel that displays images using a screen, and all types of display panels such as an organic light emitting display panel including an organic light emitting layer, a micro light emitting diode display panel using a micro light emitting diode (LED), a quantum dot light emitting display panel using a quantum dot light emitting diode including a quantum dot light emitting layer or an inorganic light emitting display panel using an inorganic light emitting diode including an inorganic semiconductor may be applied to the display panel PNL according to some embodiments.

The display panel PNL may be a flexible panel. The display panel PNL may have flexibility that may be partially rolled, bent, or curved within the panel accommodating container SD, as will be described in more detail later. The display panel PNL may slide along the first direction DR1.

The display panel PNL may include an active area AA and a non-active area NAA.

The active area AA of the display panel PNL may be an area in which a plurality of pixels PX are located. The active area AA may include a first active area AA_1 supported by a main plate MPL, which will be described later, a second active area AA_2 supported by a plurality of segments SG, and a third active area AA_3 supported by a plurality of segments SG. The first active area AA_1 of the display panel PNL may be a regular flat area capable of maintaining a flat shape regardless of a sliding operation.

The second active area AA_2 and the third active area AA_3 of the display panel PNL may be rolled, bent or curved, or may be a bending area or a bendable area in which the rolled, bent or curved shape and the flat shape are changed depending on the sliding operation of the display device 1. The second active area AA_2 and the third active area AA_3 of the display panel PNL may be bent by a roller.

The display area DA of the display panel PNL may be an area on which a screen is displayed. The display area DA may be categorized into a first display area DA_1, a second display area DA_2 and a third display area DA_3 depending on whether and how much the display panel PNL is slid. The presence and size of the second display area DA_2 and the third display area DA_3 may vary depending on whether and how much the second display area DA_2 and the third display area DA_3 are slid. In detail, in a non-sliding state, the display panel PNL has a first display area DA_1 of a first size. In a sliding state, the display area DA further includes a second display area DA_2 and a third display area DA_3 in addition to the first display area DA_1.

The first display area DA_1 may overlap the first active area AA_1 of the display panel PNL. The second display area DA_2 may overlap at least a portion of the second active area AA_2 of the display panel PNL. The third display area DA_3 may overlap at least a portion of the third active area AA_3 of the display panel PNL. In detail, the second display area DA_2 may be an area where the second active area AA_2 of the display panel PNL and the display device flat area PA overlap each other, and the third display area DA_3 may be an area where the third active area AA_3 of the display panel PNL and the display device flat area PA overlap each other.

In some embodiments, a boundary between the first display area DA_1 and the second display area DA_2 may be matched with a boundary between the first active area AA_1 and the second active area AA_2, and a boundary between the first display area DA_1 and the second display area DA_2 may be matched with a boundary between the first active area AA_1 and the third active area AA_3, but the disclosure is not limited thereto.

Sizes of the second display area DA_2 and the third display area DA_3 may vary depending on the degree of sliding. For example, in a state that the display device 1 is slid to a maximum range, the second display area DA_2 has a second size, the third display area DA_3 has a third size, and the display area DA has a fourth size in which the first size, the second size and the third size are added to one another. In this case, the fourth size may be a maximum size of the display area DA.

The non-active area NAA of the display panel PNL may be an area where pixels are not located. Metal lines, such as data/scan lines, a touch line or a power voltage line, may be located in the non-active area NAA. The non-active area NAA may include a bezel area BZ and a dummy area DM. The non-active area NAA may be arranged to surround the active area AA.

The bezel area BZ may be located at both ends of the active area AA in the second direction DR2 as shown in FIGS. 3 and 5. In detail, the bezel area BZ may include a first bezel area BZa located at one end of the active area AA in the second direction DR2, and a second bezel area BZb located at the other end of the active area AA in the second direction DR2.

The first bezel area BZa may include a first portion BZa_1 which is a portion overlapped with the first active area AA_1 in the second direction DR2, a second portion BZa_2 which is a portion overlapped with the second active area AA_2 in the second direction DR2, and a third portion BZa_3 which is a portion overlapped with the third active area AA_3 in the second direction DR2. As described above, the first active area AA_1 is a regular flat area, and the first portion BZa_1 of the first bezel area BZa may be also a regular flat area. Likewise, the second active area AA_2 and the third active area AA_3 may be bendable areas, and the second portion BZa_2 and the third portion BZa_3 of the first bezel area BZa may be also bendable areas.

The second bezel area BZb may include a first portion BZb_1 which is a portion overlapped with the first active area AA_1 in the second direction DR2, a second portion BZb_2 which is a portion overlapped with the second active area AA_2 in the second direction DR2, and a third portion BZb_3 which is a portion overlapped with the third active area AA_3 in the second direction DR2. As described above, the first active area AA_1 is a regular flat area, and the first portion BZb_1 of the second bezel area BZb may be also a regular flat area. Likewise, the second active area AA_2 and the third active area AA_3 may be bendable areas, and the second portion BZb_2 and the third portion BZb_3 of the second bezel area BZb may be also a bendable area.

The dummy area DM may be located at both ends of the active area AA in the first direction DR1 as shown in FIGS. 3 and 5. For example, the dummy area DM located at the end of the second active area AA_2 in the first direction DR1 may be referred to as a first dummy area DM_1, and the dummy area DM located at the end of the third active area AA_3 in the first direction DR1 may be referred to as a second dummy area DM_2.

The dummy area DM may be slid or bent in accordance with behavior of the display device 1. In other words, the dummy area DM may be included in the bendable area of the display panel PNL. Meanwhile, an end of the dummy area DM, which is not adjacent to the second active area AA_2 or the third active area AA_3, may be an end of a bending area or a bendable area of the display panel PNL. In some embodiments, the dummy area DM may be supported by the plurality of segments SG, but embodiments according to the present disclosure are not limited thereto.

The display panel PNL further includes a sub-area SBA. The sub-area SBA may be located on the other side of the first active area AA_1 of the display panel PNL in the second direction DR2. In other words, the sub-area SBA may be protruded from the non-active area NAA to the other side in the second direction DR2.

The sub-area SBA may overlap the first active area AA_1 in the second direction DR2, and may not overlap the second active area AA_2 and the third active area AA_3 in the second direction DR2.

In some embodiments, the sub-area SBA may have a rectangular planar shape, but embodiments according to the present disclosure are not limited thereto. In some embodiments, a length of the sub-area SBA in the first direction DR1 may be substantially the same as a length of the first active area AA_1 in the first direction DR1, but is not limited thereto. Alternatively, the length of the sub-area SBA in the first direction DR1 may be shorter than the length of the first active area AA_1 in the first direction DR1. A length of the sub-area SBA in the second direction DR2 may be shorter than a length of the first active area AA_1 in the second direction DR2.

The sub-area SBA may be an area that is curved, twisted or bent. When the sub-area SBA is curved, the sub-area SBA may be located in a space formed by bending the second active area AA_2 and the third active area AA_3 of the display panel PNL to overlap the first active area AA_1 in the third direction DR3. Due to the above configuration, the display device 1 according to some embodiments of the disclosure may make sure an internal space to a maximum range while minimizing or reducing a thickness caused by bending of the display panel PNL.

A first driving circuit DC1, a first circuit board CB1, a second driving circuit DC2, and a second circuit board CB2 may be located on one side of the sub-area SBA in the third direction DR3.

The first circuit board CB1 and the second circuit board CB2 may be attached onto an upper surface of the sub-area SBA by using an anisotropic conductive film (ACF). The first circuit board CB1 and the second circuit board CB2 may be electrically connected to a pad portion formed on the sub-area SBA. The first circuit board CB1 and the second circuit board CB2 may be a flexible printed circuit board, a printed circuit board, or a flexible film such as a chip on film.

The first driving circuit DC1 and the second driving circuit DC2 may be formed of an integrated circuit (IC), and may be attached onto the sub-area SBA in a chip-on-glass (COG) method, a chip-on plastic (COP) method, or an ultrasonic method. Alternatively, the first driving circuit DC1 and the second driving circuit DC2 may be attached onto the first circuit board CB1 and the second circuit board CB2, respectively. In FIG. 3, the first driving circuit DC1 is attached onto the first circuit board CB1, the second driving circuit DC2 is attached onto the second circuit board CB2, the first circuit board CB1 and the second circuit board CB2 are spaced apart from each other, and the first driving circuit DC1 and the second driving circuit DC2 are spaced apart from each other in the first direction DR1.

The panel support SP may serve to support a bottom surface of the display panel PNL. The panel support SP may be attached to the bottom surface of the display panel PNL to support the display panel PNL.

An adhesive ADH may be interposed between the panel support SP and the display panel PNL. In some embodiments, the adhesive ADH may be a pressure sensitive adhesive (PSA), but embodiments according to the present disclosure are not limited thereto. The panel support SP may include a main plate MPL and a plurality of segments SG.

The main plate MPL may serve to support the first active area AA_1 of the display panel PNL. In detail, the main plate MPL may support not only the first portion AA_1 of the display panel PNL but also the first portion BZa_1 of the first bezel area BZa and the first portion BZb_1 of the second bezel area BZb, which surround the first active area AA_1. The main plate MPL may be located between the plurality of segments SG supporting the second active area AA_2 and the plurality of segments SG supporting the third active area AA_3. The main plate MPL and the first active area AA_1 of the display panel PNL may overlap each other in the third direction DR3.

The main plate MPL may have a planar shape extended in the first direction DR1 and the second direction DR2. In other words, the main plate MPL may have a planar flat shape. The main plate MPL may have the same width in the third direction DR3 along a profile of the first active area AA_1 of the display panel PNL.

One side of the main plate MPL in the third direction DR3 may be an upper surface to which the first active area AA_1 of the display panel PNL is attached, and the other side of the main plate MPL in the third direction DR3 may be a bottom surface on which an air gap to be described later is located.

The plurality of segments SG may serve to support the second active area AA_2 and the third active area AA_3 of the display panel PNL. For example, the plurality of segments SG may support not only the second active area AA_2 and the third active area AA_3 of the display panel PNL but also the second portion BZa_2 and the third portion BZa_3 of the first bezel area BZa, the second portion BZb_2 and the third portion BZb_3 of the second bezel area BZb and the dummy area DM. The plurality of segments SG may be located on both sides of the main plate MPL in the first direction DR1.

The plurality of segments SG may be respectively extended in the second direction DR2, and may be spaced apart from each other in the first direction DR1. A width of each of the plurality of segments SG in the third direction DR3 may be thicker than a thickness of the main plate MPL. Therefore, an air gap may be formed below the main plate MPL as shown in FIG. 5. As the air gap is formed below the main plate MPL, an impact applied to the display panel PNL may be mitigated. For example, when an object such as a pen of a user falls from the first active area AA_1 of the display panel PNL, the air gap may absorb such an impact.

The main plate MPL and the plurality of segments SG may have substantially the same relative positional relationship with respect to the display panel PNL. That is, when the display panel PNL is flatly unfolded without bending, at least one plane parallel with the display panel PNL may simultaneously pass through the main plate MPL and the plurality of segments SG.

As shown in FIGS. 1 and 2, the panel accommodating container SD may serve to accommodate at least a portion of the display panel PNL and assist the sliding operation of the display device 1. The panel accommodating container SD may include a first accommodating container SD_1 located at the center of the display device 1, a second accommodating container SD_2 located on one side of the first accommodating container SD_1 in the first direction DR1, including the first display device bending area RA_1, and a third accommodating container SD_3 located on the other side of the first accommodating container SD_1 in the first direction DR1, including the second display device bending area RA_2.

The first accommodating container SD_1 may connect the second accommodating container SD_2 with the third accommodating container SD_3. In detail, the first accommodating container SD_1 may include a (1_1)th accommodating container SD_1a connecting the other side of the second accommodating container SD_2 in the second direction DR2 with the other side of the third accommodating container SD_3 in the second direction DR2, and a (1_2)th accommodating container SD_1b connecting one side of the second accommodating container SD_2 in the second direction DR2 with one side of the third accommodating container SD_3 in the second direction DR2.

According to some embodiments, a rail may be formed inside the second accommodating container SD_2 and the third accommodating container SD_3 so as to guide the sliding operation of the display panel PNL, but embodiments according to the present disclosure are not limited thereto. Hereinafter, a structure of a plurality of pixels PX located in the active area AA of the display device 1 according to some embodiments will be described.

Figure 6:
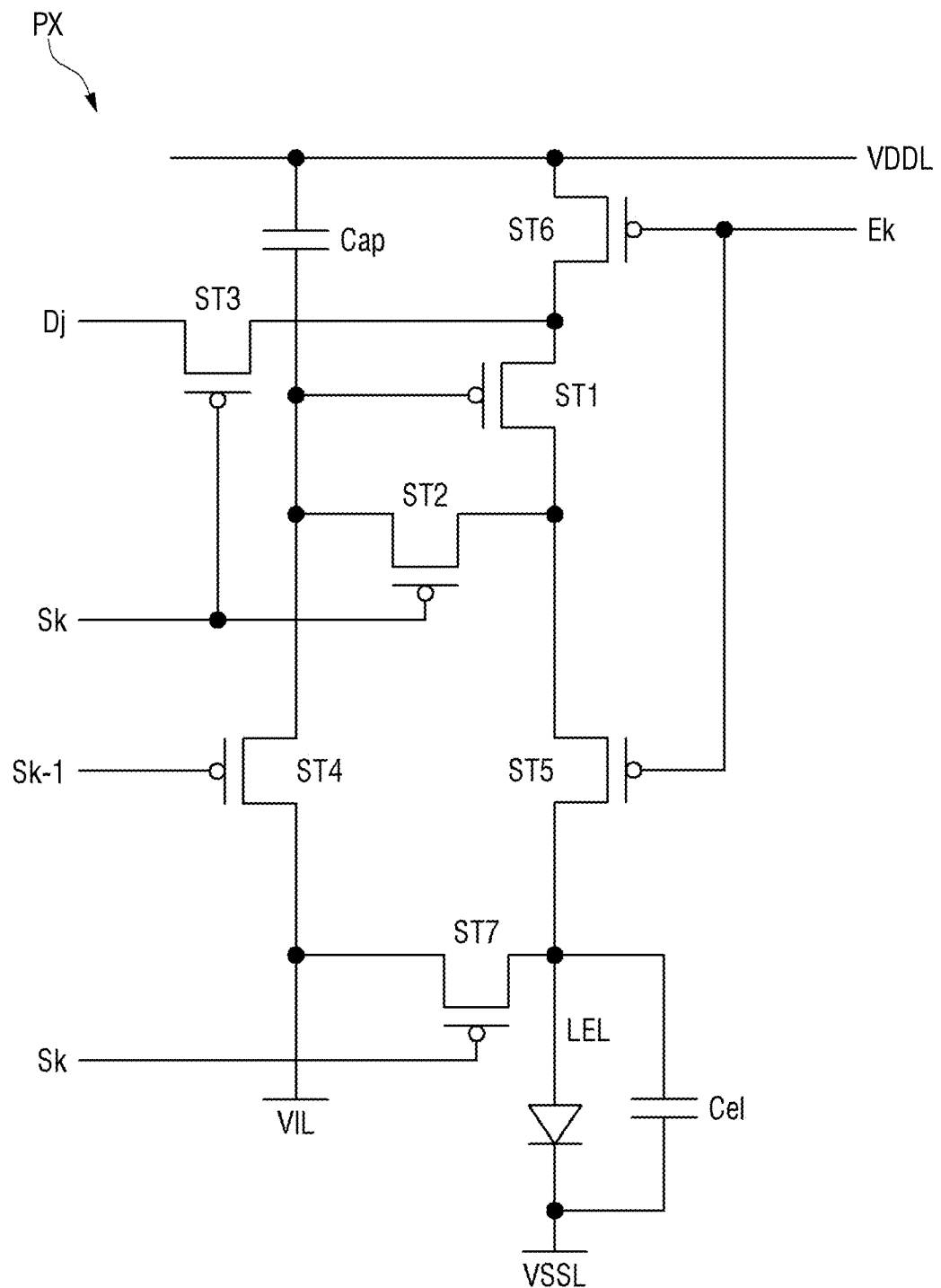
FIG. 6 is a circuit view illustrating a circuit structure of a pixel of a display device according to some embodiments.

FIG. 6 is a circuit view illustrating a circuit structure of a pixel of a display device according to some embodiments.

Referring to FIG. 6, the pixel PX may be connected to a (k−1)th scan line Sk−1, a (k)th scan line Sk and a (j)th data line Dj, wherein k and j may be natural numbers greater than or equal to 1. The pixel PX may be connected to a first power voltage line VDDL to which a first power voltage is applied, an initialization voltage line VIL to which an initialization voltage is applied, and a second power voltage line VSSL to which a second power voltage lower than the first power voltage is applied.

The pixel PX includes a plurality of thin film transistors, a light emitting element LEL, and a capacitor. The plurality of thin film transistors include a driving transistor DT and a switching transistor SW. The driving transistor DT may receive the first power voltage or the second power voltage to supply a driving current to the light emitting element LEL, and the switching transistor SW may transfer a data signal to the driving transistor DT. The pixel PX may include a first thin film transistor ST1 as the driving transistor DT, may include a second thin film transistor ST2, a third thin film transistor ST3, a fourth thin film transistor ST4, a fifth thin film transistor ST5, a sixth thin film transistor ST6 and a seventh thin film transistor ST7 as switching thin film transistors, and may include a first electrode, a second electrode and a light emitting layer EML as the light emitting element LEL.

The first thin film transistor ST1 may include a first gate electrode, a first semiconductor pattern layer, a first electrode, and a second electrode. The first thin film transistor ST1 controls a drain-source current flowing between the first electrode and the second electrode in accordance with a data voltage applied to the first gate electrode. The driving current flowing through a channel of the first thin film transistor ST1 is proportional to square of a difference between a voltage between the first gate electrode and the first electrode and a threshold voltage of the first thin film transistor ST1 as expressed in Equation 1.

$$Ids = k' \times (Vgs - Vth)^2 \quad \text{[Equation 1]}$$

In Equation 1, k' denotes a proportional coefficient determined by a structure and physical characteristics of the first thin film transistor ST1, Vgs denotes a gate-source voltage of the first thin film transistor ST1, Vth denotes a threshold voltage of the first thin film transistor ST1, and Ids denotes a driving current.

The light emitting element LEL may serve to emit light in accordance with the driving current. The light emitting amount of the light emitting element LEL may be proportional to the driving current. The light emitting element LEL may include a first electrode, a second electrode, and a light emitting layer located between the first electrode and the second electrode. The first electrode may be an anode electrode, and the second electrode may be a cathode electrode.

The first electrode of the light emitting element LEL may be connected to a first electrode of the seventh thin film transistor ST7 and a second electrode of the fifth thin film transistor ST5, which will be described in more detail later, and the second electrode thereof may be connected to the second power voltage line VSSL. In some embodiments, a parasitic capacitance Cel may be formed between the first electrode and the second electrode of the light emitting element LEL, but embodiments according to the present disclosure are not limited thereto. For example, the parasitic capacitance Cel between the first electrode and the second electrode of the light emitting element LEL may be omitted according to some embodiments.

The second thin film transistor ST2 is turned on by a scan signal of the (k)th scan line Sk to connect the first gate electrode with the second electrode of the first thin film transistor ST1. That is, when the second thin film transistor ST2 is turned on, because the first gate electrode and the second electrode of the first thin film transistor ST1 are connected to each other, the first thin film transistor ST1 is driven as a diode. The second thin film transistor ST2 may include a second gate electrode, a second semiconductor pattern layer, a first electrode, and a second electrode. The second gate electrode may be connected to the (k)th scan line Sk, the first electrode of the second thin film transistor ST2 may be connected to the second electrode of the first thin film transistor ST1, and the second electrode of the second thin film transistor ST2 may be connected to the first gate electrode of the first thin film transistor ST1.

The third thin film transistor ST3 is turned on by the scan signal of the (k)th scan line Sk to connect the first electrode of the first thin film transistor ST1 with the (j)th data line Dj. The third thin film transistor ST3 may include a third gate electrode, a third semiconductor pattern layer, a first electrode, and a second electrode. The third gate electrode of the third thin film transistor ST3 may be connected to the (k)th scan line Sk, the first electrode of the third thin film transistor ST3 may be connected to the first electrode of the first thin film transistor ST1, and the second electrode of the third thin film transistor ST3 may be connected to the (j)th data line Dj.

The fourth thin film transistor ST4 is turned on by the scan signal of the (k−1)th scan line Sk−1 to connect the first gate electrode of the first thin film transistor ST1 with the initialization voltage line VIL. The first gate electrode of the first thin film transistor ST1 may be discharged by an initialization voltage of the initialization voltage line VIL. The fourth thin film transistor ST4 may include a fourth gate electrode, a fourth semiconductor pattern layer, a first electrode, and a second electrode. The fourth gate electrode of the fourth thin film transistor ST4 may be connected to the (k−1)th scan line Sk−1, the first electrode of the fourth thin film transistor ST4 may be connected to the first gate electrode of the first thin film transistor ST1, and the second electrode of the fourth thin film transistor ST4 may be connected to the initialization voltage line VIL.

The fifth thin film transistor ST5 is connected between the second electrode of the first thin film transistor ST1 and the first electrode of the light emitting element LEL. The fifth thin film transistor ST5 is turned on by a light emitting control signal of a (k)th light emission line Ek to connect the second electrode of the first thin film transistor ST1 with the first electrode of the light emitting element LEL. The fifth thin film transistor ST5 may include a fifth gate electrode, a fifth semiconductor pattern layer, a first electrode, and a second electrode. The fifth gate electrode of the fifth thin film transistor ST5 is connected to the (k)th light emission line Ek, the first electrode of the fifth thin film transistor ST5 is connected to the second electrode of the first thin film transistor ST1, and the second electrode of the fifth thin film transistor ST5 is connected to the first electrode of the light emitting element LEL.

The sixth thin film transistor ST6 is turned on by the light emitting control signal of the (k)th light emission line Ek to connect the first electrode of the first thin film transistor ST1 with the first power voltage line VDDL. The sixth thin film transistor ST6 may include a sixth gate electrode, a sixth semiconductor pattern layer, a first electrode, and a second electrode. The sixth gate electrode of the sixth thin film transistor ST6 is connected to the (k)th light emission line Ek, the first electrode of the sixth thin film transistor ST6 is connected to the first power voltage line VDDL, and the second electrode of the sixth thin film transistor ST6 is connected to the first electrode of the first thin film transistor ST1. When the fifth thin film transistor ST5 and the sixth thin film transistor ST6 are all turned on, the driving current may be supplied to the light emitting element LEL.

The seventh thin film transistor ST7 is turned on by the scan signal of the (k)th scan line Sk to connect the first electrode of the light emitting element LEL with the initialization voltage line VIL. The first electrode of the light emitting element LEL may be discharged by the initialization voltage. The seventh thin film transistor ST7 may include a seventh gate electrode, a seventh semiconductor pattern layer, a first electrode and a second electrode. The seventh gate electrode of the seventh thin film transistor ST7 is connected to the (k)th scan line Sk, the first electrode of the seventh thin film transistor ST7 is connected to the first electrode of the light emitting element LEL, and the second electrode of the seventh thin film transistor ST7 is connected to the initialization voltage line VIL.

A capacitor Cap is formed between the first gate electrode of the first thin film transistor ST1 and the first power voltage line VDDL. One electrode of the capacitor Cap may be connected to the first gate electrode of the first thin film transistor ST1, and the other electrode thereof may be connected to the first power voltage line VDDL.

When the first electrode of each of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 is a source electrode, the second electrode may be a drain electrode. Alternatively, when the first electrode of each of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 is a drain electrode, the second electrode may be a source electrode.

Each of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 may include a semiconductor pattern layer as described above. Each of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 may include a semiconductor pattern layer made of polycrystalline silicon, but embodiments according to the present disclosure are not limited thereto. For example, each of the first thin film transistor ST1, the third thin film transistor ST3, the fifth thin film transistor ST5, the sixth thin film transistor ST6, and the seventh thin film transistor ST7 may include a semiconductor pattern layer made of polycrystalline silicon, and each of the second thin film transistor ST2 and the fourth thin film transistor ST4 may include a semiconductor pattern layer made of oxide.

When the semiconductor pattern layer of each of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 is made of polycrystalline silicon, a process for forming the semiconductor pattern layer may be a low temperature polycrystalline silicon process. In FIG. 6, all of the first thin film transistor ST1, the second thin film transistor ST2, the third thin film transistor ST3, the fourth thin film transistor ST4, the fifth thin film transistor ST5, the sixth thin film transistor ST6 and the seventh thin film transistor ST7 are described as being formed of p-type thin film transistors, but embodiments according to the present disclosure not limited thereto, and some or all of them may be formed of n-type thin film transistors. For example, as described above, when each of the first thin film transistor ST1, the third thin film transistor ST3, the fifth thin film transistor ST5, the sixth thin film transistor ST6 and the seventh thin film transistor ST7 includes a semiconductor pattern layer made of polycrystalline silicon, and each of the second thin film transistor ST2 and the fourth thin film transistor ST4 includes a semiconductor pattern layer made of oxide, the first thin film transistor ST1, the third thin film transistor ST3, the fifth thin film transistor ST5, the sixth thin film transistor ST6 and the seventh thin film transistor ST7 may be formed of p-type thin film transistors, and the second thin film transistor ST2 and the fourth thin film transistor ST4 may be formed of n-type thin film transistors.

Hereinafter, an arrangement structure of a first power supply 100 and a second power supply 200, which supply the first power voltage and the second power voltage to the plurality of pixels PX located on the display panel PNL of the display device 1 according to some embodiments, will be described.

Figure 7:
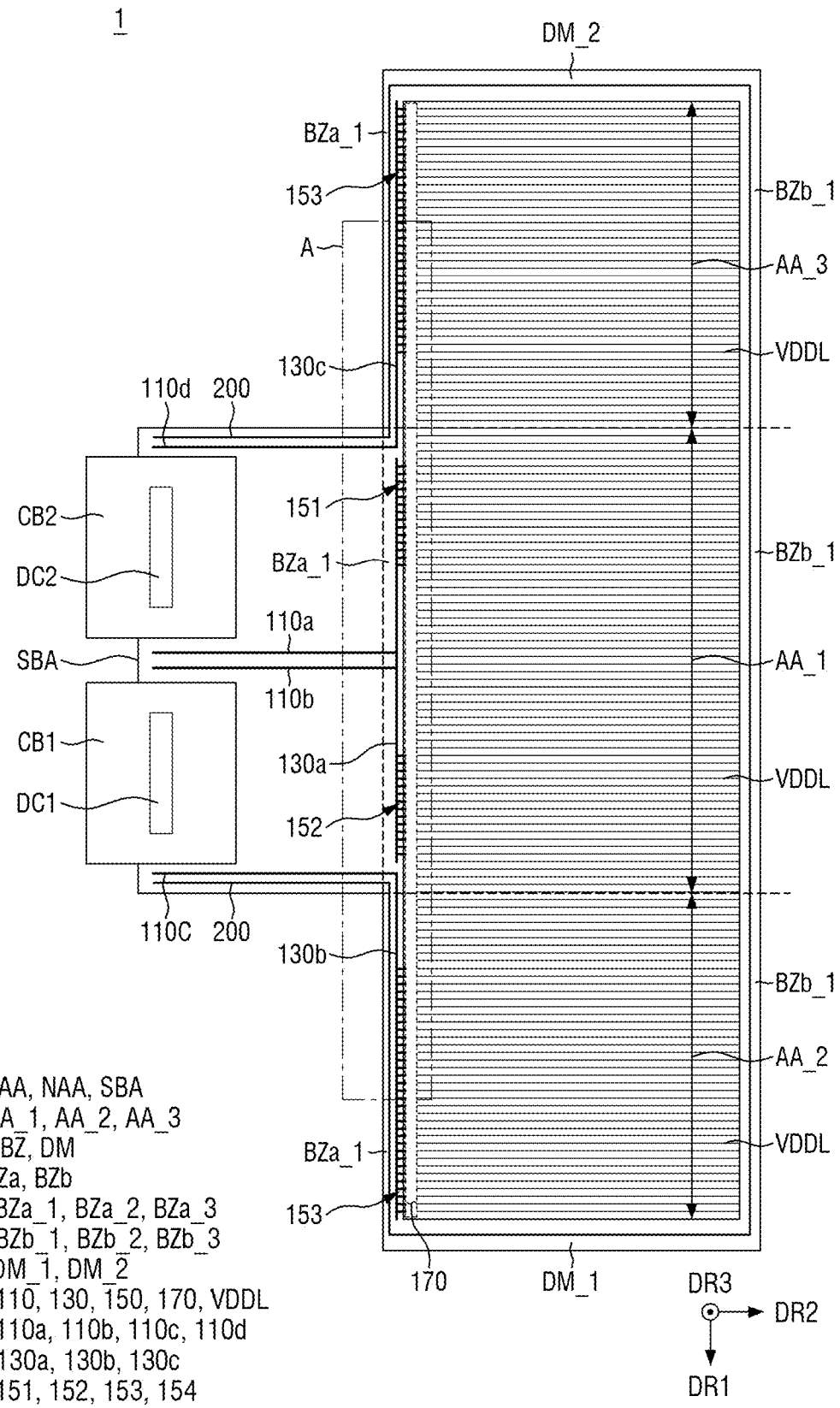
FIG. 7 is a schematic structural view illustrating a structure of a first power supply and a second power supply, which are located on a display panel of a display device according to some embodiments.
Figure 8:
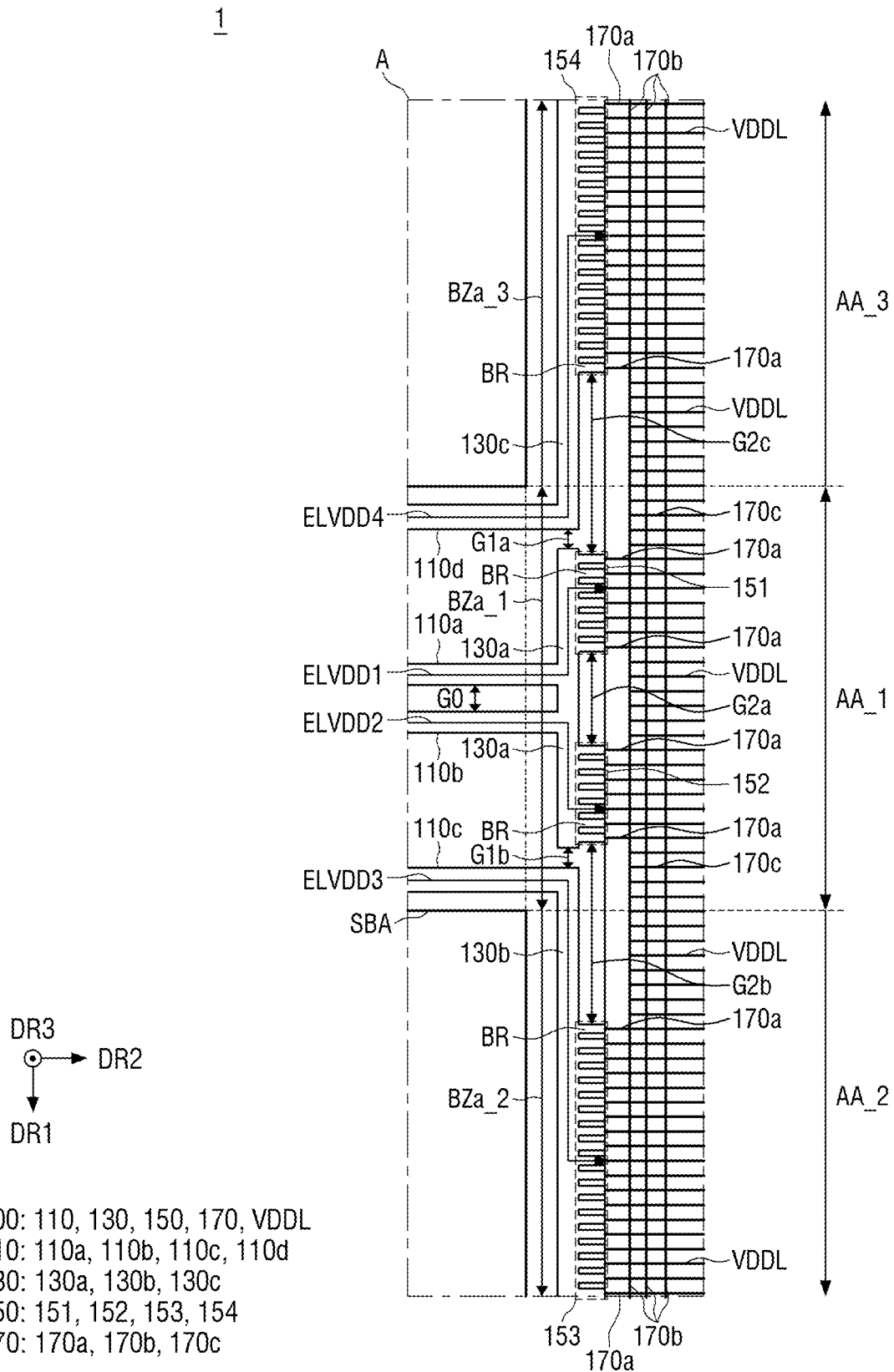
FIG. 8 is an enlarged view illustrating an area A of FIG. 7.
Figure 9:
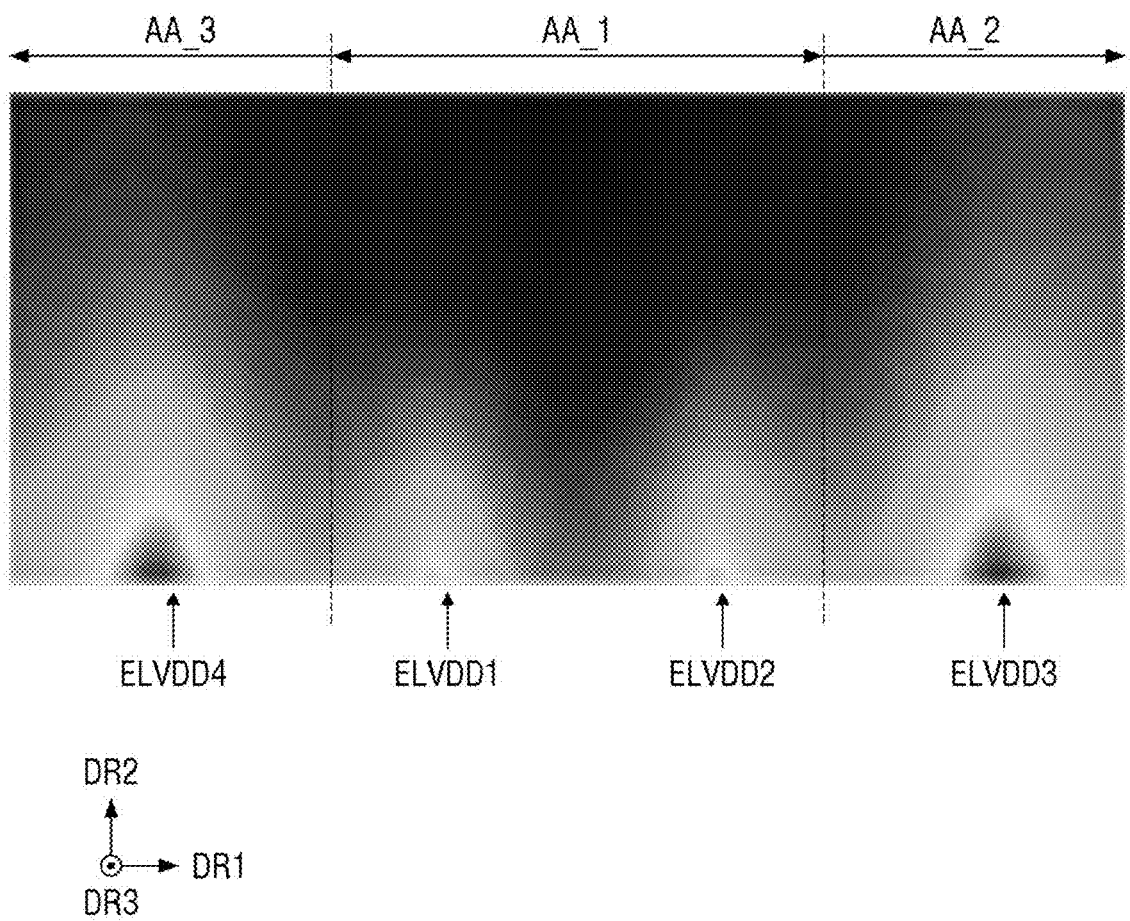
FIG. 9 is a view illustrating a simulation result of an experiment of a distribution of a first power voltage of a display device according to some embodiments.
Figure 10:
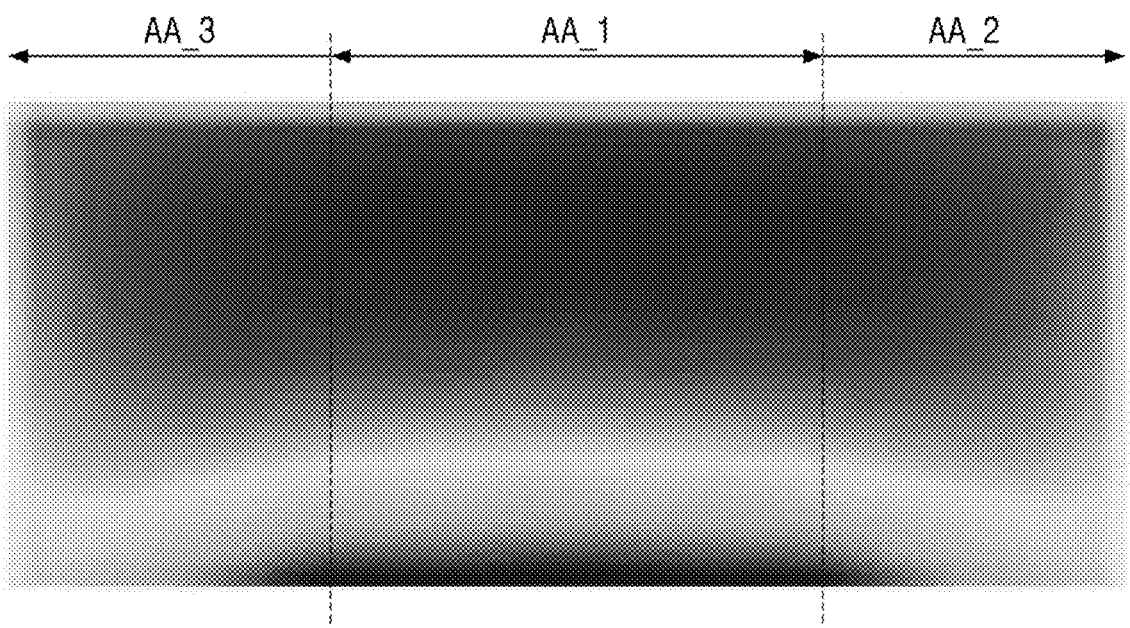
FIG. 10 is a view illustrating a simulation result of an experiment of a distribution of a second power voltage of a display device according to some embodiments.
Figure 10:
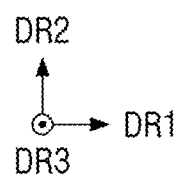
Figure 11:
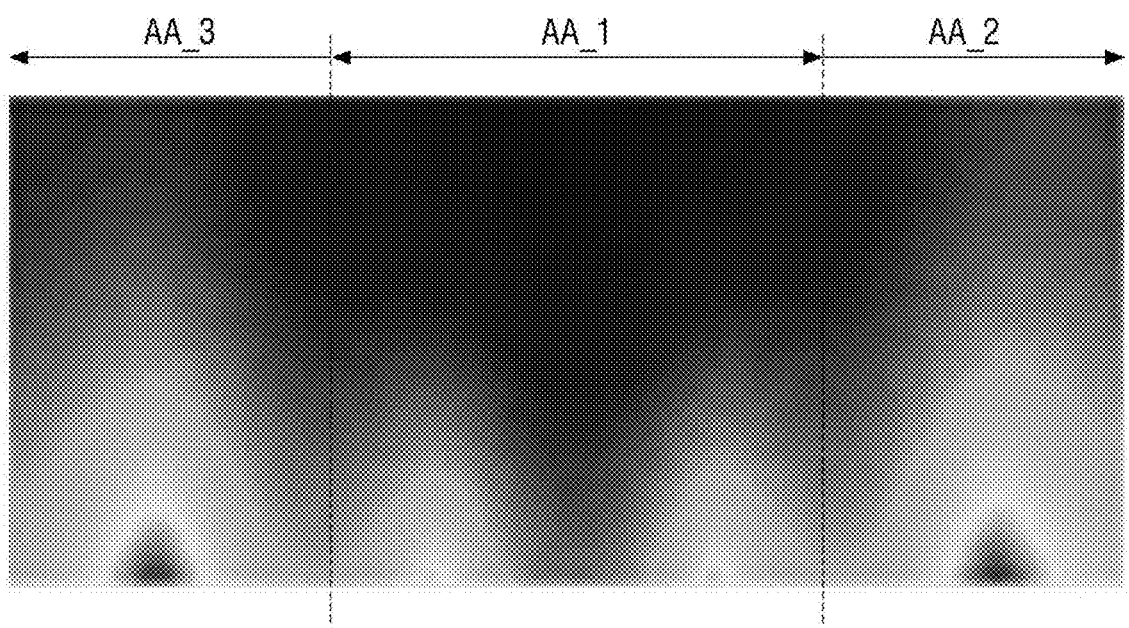
FIG. 11 is a view illustrating a simulation result of an experiment of a luminance deviation of a pixel of a display device according to some embodiments.
Figure 11:
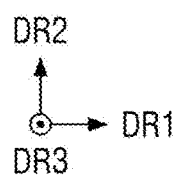

FIG. 7 is a schematic structural view illustrating a structure of a first power voltage line and a second power voltage line, which are located on a display panel of a display device according to some embodiments. FIG. 8 is an enlarged view illustrating an area A of FIG. 7. FIG. 9 is a view illustrating a simulation result of an experiment of a distribution of a first power voltage of a display device according to some embodiments. FIG. 10 is a view illustrating a simulation result of an experiment of a distribution of a second power voltage of a display device according to some embodiments. FIG. 11 is a view illustrating a simulation result of an experiment of a luminance deviation of a pixel of a display device according to some embodiments.

Referring to FIGS. 7 and 8, the first power supply 100 and the second power supply 200 may be arranged to be spaced apart from each other on the upper surface of the display panel PNL. For convenience of description, hatching of the non-active area NAA is omitted in FIG. 7, and the second power supply 200 of FIG. 7 is omitted in FIG. 8.

The first power supply 100 may serve to supply the first power voltage for driving the plurality of pixels PX to the plurality of pixels PX. The first power supply 100 may include a first power lead-in portion 110, a voltage bar 130, a bridge part 150, a mesh portion 170, and a first power voltage line VDDL.

The first power lead-in portion 110 of the first power supply 100 may serve to lead the first power voltage in the display panel PNL. The first power lead-in portion 110 may be located on a sub-area SBA and extended in the second direction DR2.

The first power lead-in portion 110 may include a first lead-in portion 110a, a second lead-in portion 110b, a third lead-in portion 110c, and a fourth lead-in portion 110d. In addition, the first power voltage may include a (1_1)th power voltage ELVDD1, a (1_2)th power voltage ELVDD2, a (1_3)th power voltage ELVDD3, and a (1_4)th power voltage ELVDD4. Potential values of the (1_1)th power voltage ELVDD1, the (1_2)th power voltage ELVDD2, the (1_3)th power voltage ELVDD3, and the (1_4)th power voltage ELVDD4 may be substantially the same as one another.

The first lead-in portion 110a may apply the (1_1)th power voltage ELVDD1, the second lead-in portion 110b may apply the (1_2)th power voltage ELVDD2, the third lead-in portion 110c may apply the (1_3)th power voltage ELVDD3, and the fourth lead-in portion 110d may apply the (1_4)th power voltage ELVDD4.

The first lead-in portion 110a, the second lead-in portion 110b, the third lead-in portion 110c and the fourth lead-in portion 110d may be arranged to be spaced apart from one another in the first direction DR1. In other words, the fourth lead-in portion 110d, the first lead-in portion 110a, the second lead-in portion 110b, and the third lead-in portion 110c may be sequentially arranged on the sub-area SBA based on one side in the first direction DR1. In detail, the first lead-in portion 110a and the fourth lead-in portion 110d may be spaced apart from each other with the second circuit board CB2 interposed therebetween, the second lead-in portion 110b and the third lead-in portion 110c may be spaced apart from each other with the first circuit board CB1 interposed therebetween, and the first lead-in portion 110a and second lead-in portion 110b may be spaced apart from each other with a gap (e.g., a set or predetermined gap) G0. Meanwhile, because the first lead-in portion 110a, the second lead-in portion 110b, the third lead-in portion 110c and the fourth lead-in portion 110d are arranged on the sub-area SBA, the first to fourth lead-in portions may overlap the first active area AA_1 in the second direction DR2.

As the first lead-in portion 110a and the fourth lead-in portion 110d are spaced from each other with the second circuit board CB2 interposed therebetween, the first lead-in portion 110a and the fourth lead-in portion 110d may be electrically insulated from the second driving circuit DC2 located on the second circuit board CB2, and as the second lead-in portion 110b and the third lead-in portion 110c are spaced from each other with the first circuit board CB1 interposed therebetween, the second lead-in portion 110b and the third lead-in portion 110c may be electrically insulated from the first driving circuit DC1 located on the first circuit board CB1.

The voltage bar 130 of the first power supply 100 may receive the first power voltage from the first power lead-in portion 110 to distribute the first power voltage to each area of the active area AA. The voltage bar 130 may be extended in the first direction DR1. The voltage bar 130 may include a first voltage bar 130a, a second voltage bar 130b, and a third voltage bar 130c, which are spaced apart from one another in the first direction DR1.

The first voltage bar 130a may serve to distribute the (1_1)th power voltage ELVDD1 and the (1_2)th power voltage ELVDD2 of the first power voltage to the first active area AA_1. For example, the first lead-in portion 110a and the second lead-in portion 110b of the first power lead-in portion 110 may be connected to a central portion of the first voltage bar 130a. Therefore, the (1_1)th power voltage ELVDD1 applied from the first lead-in portion 110a and the (1_2)th power voltage ELVDD2 applied from the second lead-in portion 110b may be conducted to the first voltage bar 130a.

The first voltage bar 130a may be located on the first portion BZa_1 of the first bezel area BZa and extended in the first direction DR1 along the first active area AA_1, and may overlap the first active area AA_1 in the second direction DR2. In other words, the first voltage bar 130a may be located on the other side of the first active area AA_1 in the second direction DR2. In some embodiments, the first voltage bar 130a may be located only in the first portion BZa_1 of the first bezel area BZa, and may not overlap the second active area AA_2 and the third active area AA_3 in the second direction DR2, but is not limited thereto.

The second voltage bar 130b may serve to distribute the (1_3)th power voltage ELVDD3 of the first power voltage to the second active area AA_2. In detail, the third lead-in portion 110c may be connected to the other end of the second voltage bar 130b in the first direction DR1. Therefore, the (1_3)th power voltage ELVDD3 applied from the third lead-in portion 110c may be conducted to the second voltage bar 130b.

The second voltage bar 130b may be spaced apart from one side of the first voltage bar 130a in the first direction DR1 with a gap (e.g., a set or predetermined gap) G1b in the first direction DR1. The second voltage bar 130b may be located on the second portion BZa_2 of the first bezel area BZa and extended in the first direction DR1 along the second active area AA_2, and may overlap the second active area AA_2 in the second direction DR2. In other words, the second voltage bar 130b may be located on the other side of the second active area AA_2 in the second direction DR2. In some embodiments, a portion of the other side of the second voltage bar 130b in the first direction DR1 may overlap the first active area AA_1 in the second direction DR2. This may be caused by connection of the third lead-in portion 110c to the other end of the second voltage bar 130b in the first direction DR1.

The third voltage bar 130c may serve to distribute the (1_4)th power voltage ELVDD4 of the first power voltage to the third active area AA_3. In detail, the fourth lead-in portion 110d may be connected to one end of the third voltage bar 130c in the first direction DR1. Therefore, the (1_4)th power voltage ELVDD4 applied from the fourth lead-in portion 110d may be conducted to the third voltage bar 130c.

The third voltage bar 130c may be spaced apart from the other side of the first voltage bar 130a in the first direction DR1 with a gap (e.g., a set or predetermined gap) G1b in the first direction DR1. The third voltage bar 130c may be located on the third portion BZa_3 of the first bezel area BZa and extended in the first direction DR1 along the third active area AA_3, and may overlap the third active area AA_3 in the second direction DR2. In other words, the third voltage bar 130c may be located on the other side of the third active area AA_3 in the second direction DR2. In some embodiments, a portion of one side of the third voltage bar 130c in the first direction DR1 may overlap the first active area AA_1 in the second direction DR2. This may be caused by connection of the fourth lead-in portion 110d to one end of the third voltage bar 130c in the first direction DR1.

The bridge part 150 of the first power supply 100 may serve to receive the first power voltage from the voltage bar 130 to transfer the first power voltage to the mesh portion 170 located in the active area AA. The bridge part 150 may be protruded from the voltage bar 130 in the second direction DR2 that is a direction toward the active area AA.

The bridge part 150 may include a first bridge part 151, a second bridge part 152, a third bridge part 153 and a fourth bridge part 154, which are spaced apart from one another in the first direction DR1. Each of the first bridge part 151, the second bridge part 152, the third bridge part 153 and the fourth bridge part 154 may include a plurality of bridges BR. The plurality of bridges BR may be extended in the second direction DR2, and may be spaced apart from each other in the first direction DR1. Each of the plurality of bridges BR may be electrically connected to the mesh portion 170 that will be described later.

The first bridge part 151 may serve to transfer the (1_1)th power voltage ELVDD1 to the mesh portion 170, and the second bridge part 152 may serve to transfer the (1_2)th power voltage ELVDD2 to the mesh portion 170.

The first bridge part 151 may be located at the other end of the first voltage bar 130a in the first direction DR1, the second bridge part 152 may be located at one end of the second voltage bar 130b in the first direction DR1, and the first bridge part 151 and the second bridge part 152 may be spaced apart from each other in the first direction DR1 with a gap (e.g., a set or predetermined gap) G2a. The gap G2a between the first bridge part 151 and the second bridge part 152 may be defined as a gap between a bridge BR located at one end in the first direction DR1 among the plurality of bridges BR constituting the first bridge part 151 and a bridge BR located at the other end in the first direction DR1 among the plurality of bridges BR constituting the second bridge part 152. In this case, the gap G2a between the first bridge part 151 and the second bridge part 152 may be greater than the gap G0 between the first lead-in portion 110a and the second lead-in portion 110b. Therefore, the first voltage bar 130a may include an insulating portion in which the first bridge part 151 and the second bridge part 152 are not located, a first conducting portion in which the first bridge part 151 is located, and a second conducting portion in which the second bridge part 152 is located. In addition, the gap space between the first bridge part 151 and the second bridge part 152, that is, the insulating portion may overlap the first lead-in portion 110a and the second lead-in portion 110b in the second direction DR2.

The insulating portion of the first voltage bar 130a may be insulated from the mesh portion 170 because the first bridge part 151 and the second bridge part 152 are not located, and the first conducting portion and the second conducting portion may be electrically connected to the mesh portion 170 because the first bridge part 151 and the second bridge part 152 are located. In other words, because the insulating portion of the first voltage bar 130a overlaps the first lead-in portion 110a and the second lead-in portion 110b in the second direction DR2, the (1_1)th power voltage ELVDD1 and the (1_2)th power voltage ELVDD2 distributed to the first voltage bar 130a are not conducted to the mesh portion 170 through a path straight to the second direction DR2, and may be conducted to the mesh portion 170 through a path toward the first bridge part 151 or the second bridge part 152 after being bent in the first direction DR1.

In other words, the (1_1)th power voltage ELVDD1 is conducted to the first bridge part 151 having a relatively short path, and the (1_2)th power voltage ELVDD2 may be conducted to the second bridge part 152 having a relatively short path.

The third bridge part 153 may serve to transmit the (1_3)th power voltage ELVDD3 to the mesh portion 170. The third bridge part 153 may be spaced apart from the second bridge part 152 in the first direction DR1 on the second voltage bar 130b with a gap (e.g., a set or predetermined gap) G2b. The gap G2b between the third bridge part 153 and the second bridge part 152 may be defined as a gap between the bridge BR located at the other end of the first direction DR1 among the plurality of bridges BR constituting the third bridge part 153 and the bridge BR located at one end of the first direction DR1 among the plurality of bridges BR constituting the second bridge part 152.

The gap G2b between the third bridge part 153 and the second bridge part 152 may be greater than the gap G1b between the first voltage bar 130a and the second voltage bar 130b. Therefore, the second voltage bar 130b may include an insulating portion in which the third bridge part 153 is not located and a conducting portion in which the third bridge part 153 is located. Because the third bridge part 153 is not located in the insulating portion of the second voltage bar 130b, the insulating portion of the second voltage bar 130b may be insulated from the mesh portion 170, and because the third bridge part 153 is located in the conducting portion, the conducting portion may be electrically connected to the mesh portion 170. In other words, because the conducting portion is located on one side of the insulating portion of the second voltage bar 130b in the first direction DR1, the (1_3)th power voltage ELVDD3 distributed to the second voltage bar 130b is not conducted to the mesh portion 170 through a path straight to the second direction DR2, and may be conducted to the mesh portion 170 through a path toward the third bridge part 153 after being bent in the first direction DR1.

The fourth bridge part 154 may serve to transfer the (1_4)th power voltage ELVDD4 to the mesh portion 170. The fourth bridge part 154 may be spaced apart from the first bridge part 151 in the first direction DR1 on the third voltage bar 130c with a gap (e.g., a set or predetermined gap) G2a. The gap G2a between the fourth bridge part 154 and the first bridge part 151 may be defined as a gap between the bridge BR located at one end in the first direction DR1 among the plurality of bridges BR constituting the fourth bridge part 154 and the bridge BR located at the other end in the first direction DR1 among the plurality of bridges BR constituting the first bridge part 151.

The gap G2a between the fourth bridge part 154 and the first bridge part 151 may be greater than the gap G1a between the first voltage bar 130a and the third voltage bar 130c. Therefore, the third voltage bar 130c may include an insulating portion in which the fourth bridge part 154 is not located and a conducting portion in which the fourth bridge part 154 is located. Because the fourth bridge part 154 is not located in the insulating portion of the third voltage bar 130c, the insulating portion of the third voltage bar 130c may be insulated from the mesh portion 170, and because the fourth bridge part 154 is located in the conducting portion, the conducting portion may be electrically connected to the mesh portion 170. In other words, because the conducting portion is located on the other side of the insulating portion of the third voltage bar 130c in the first direction DR1, the (1_4)th power voltage ELVDD4 distributed to the third voltage bar 130c is not conducted to the mesh portion 170 through a path straight to the second direction DR2, and may be conducted to the mesh portion 170 through a path toward the fourth bridge part 154 after being bent in the first direction DR1.

The mesh portion 170 of the first power supply 100 may serve to transfer the first power voltage received from the bridge part 150 to each of the plurality of first power voltage lines VDDL corresponding to each of the plurality of pixels PX. The mesh portion 170 may include a first extension line 170a and a third extension line 170c, which are extended in the second direction DR2, and a second extension line 170b extended in the first direction DR1. The first extension line 170a, the second extension line 170b, and the third extension line 170c cross one another to form a grid pattern.

The first extension line 170a may be a line electrically connected to each of the plurality of bridges BR, and the third extension line 170c may be a line that overlaps the first voltage bar 130a, the second voltage bar 130b and the third voltage bar 130c in the second direction DR2. A plurality of the first extension lines 170a and a plurality of the third extension lines 170c may be arranged to be spaced apart from each other in the first direction DR1.

The second extension line 170b is extended across the extension direction of the first extension line 170a and the third extension line 170c, and is electrically connected to the first extension line 170a and the third extension line 170c, respectively, to electrically connect the first extension line 170a with the third extension line 170c. In some embodiments, a plurality of the second extension lines 170b may be arranged, but the number of the second extension lines 170b is not particularly limited. In this case, the plurality of second extension lines 170b may be spaced apart from each other in the second direction DR2. In the example of FIG. 8, the number of the second extension lines 170b is 3.

The plurality of first power voltage lines VDDL extended in the second direction DR2 and spaced apart from each other in the first direction DR1 may be located on one side of the mesh portion 170 in the second direction DR2 based on the second extension line 170b located at one end in the second direction DR2 among the plurality of second extension lines 170b constituting the mesh portion 170. Each of the plurality of first power voltage lines VDDL may be electrically connected to each of the plurality of first extension lines 170a and the plurality of third extension lines 170c. In some embodiments, each of the plurality of first power voltage lines VDDL may be integrally formed with each of the plurality of first extension lines 170a and the plurality of third extension lines 170c, but is not limited thereto.

Referring back to FIG. 7, the second power supply 200 may serve to supply the second power voltage for driving the plurality of pixels PX to the plurality of pixels PX. The second power supply 200 may be substantially the same as the second power voltage line VSSL described with reference to FIG. 6. As shown in FIG. 7, the second power supply 200 may be arranged to surround the edge of the active area AA in the non-active area NAA.

In detail, the second power supply 200 may be extended along a portion of the other side in the first direction DR1 of the first portion BZa_1 of the first bezel area BZa, a portion of one side in the first direction DR1 of the third portion BZa_3 of the first bezel are BZa, the second dummy area DM_2, the third portion BZb_3 of the second bezel area BZb, the first portion BZb_1 of the second bezel area BZb, the second portion BZb_2 of the second bezel area BZb, the first dummy area DM_1, the second portion BZa_2 of the first bezel area BZa and the first portion of the first bezel area BZa, and one side of the sub-area SBA in the first direction DR1 by passing through the other side of the sub-area SBA in the first direction DR1. In some embodiments, the second electrode electrically connected to the second power voltage line VSSL (see FIG. 6) of the light emitting element LEL (see FIG. 6) may be arranged to extend to the non-active area NAA beyond the active area AA, and the second electrode and the second power supply 200 may be in contact with each other in the non-active area NAA.

The second power supply 200 may be electrically insulated from the first power supply 100. The first power supply 100 may be located within an area of the display panel PNL surrounded by the second power supply 200.

Due to the above-described configuration, the display device 1 according to some embodiments may have uniform luminance of the plurality of pixels PX located in the active area AA regardless of the active area AA, thereby improving display quality. For example, in the display device 1 according to some embodiments of the disclosure, the first power voltage supplied to the active area AA by the first power supply 100 is uniformly distributed depending on an area as shown in FIG. 9, and the second power voltage is relatively uniformly supplied as compared with the first power voltage depending on an area as shown in FIG. 10, so that luminance of the plurality of pixels PX may be substantially the same as the distribution of the first power voltage as shown in FIG. 11, whereby luminance of the plurality of pixels PX may be uniform depending on the area.

When the voltage bar 130 and the bridge part 150 of the first power supply 100 are not arranged to be spaced apart from each other, the first power voltage applied from the first power lead-in portion 110 tends to be conducted to the shortest path, whereby lead-in of the first power voltage may be concentrated on the first active area AA_1.

In other words, when the (1_1)th power voltage ELVDD1, the (1_2)th power voltage ELVDD2, the (1_3)th power voltage ELVDD3 and the (1_4)th power voltage ELVDD4, which are distributed from the first power voltage, follow the configuration of the display device 1 according to some embodiments as described above, as shown in FIG. 9, the (1_1)th power voltage ELVDD1 and the (1_2)th power voltage ELVDD2_1 are distributed to the first active area AA_1, the (1_3)th power voltage ELVDD3 is distributed to the second active area AA_2, the (1_4)th power voltage ELVDD4 is distributed to the third active area AA_3, and the (1_1)th power voltage ELVDD1 and the (1_2)th power voltage ELVDD2_1 are supplied to the edge portion of the first active area AA_1 by being separated without being concentrated on the center of the first active area AA_1, whereby the first power voltage may be uniformly distributed to each area of the active area AA. However, when the voltage bar 130 and the bridge part 150 of the first power supply 100 are not spaced apart from each other, the first power voltage is conducted to the shortest path, that is, a path having the lowest resistance, whereby the (1_1)th power voltage ELVDD1, the (1_2)th power voltage ELVDD2, the (1_3)th power voltage ELVDD3, and the (1_4)th power voltage ELVDD4 may be concentrated on the central portion of the first active area AA_1, and the first power voltage may not be distributed to each area of the active area AA_1. Therefore, luminance of the plurality of pixels PX may be concentrated on the first active area AA_1 so that display quality may be deteriorated.

Therefore, the first power voltage may be uniformly supplied to obtain uniform luminance of the plurality of pixels PX like the configuration of the display device 1 according to some embodiments, so that display quality may be relatively improved.

As described above, the display device 1 according to some embodiments of the disclosure may be a single slidable display device that is slid only in one direction. When the display device 1 according to some embodiments of the disclosure is a single slidable display device, the third active area AA_3 of the display panel PNL and the third voltage bar 130*c* of the first power supply 100 may be omitted, or the second active area AA_2 of the display panel PNL and the second voltage bar 130*b* of the first power supply 100 may be omitted.

For example, when the display device 1 according to some embodiments is implemented as a single slidable display device as the third active area AA_3 and the third voltage bar 130*c* are omitted, the sub-area SBA of the display panel PNL overlaps the first active area AA_1 in the second direction DR2, but may not overlap the second active area AA_2 in the second direction DR2.

Hereinafter, further details of a display device 1 according to some embodiments will be described. In the following embodiments, the same reference numerals will be given to the same elements as those of the previously described embodiments, some redundant description of the previously described embodiments will be omitted or simplified, and the description will focus on differences from the previously described embodiments.

Figure 12:
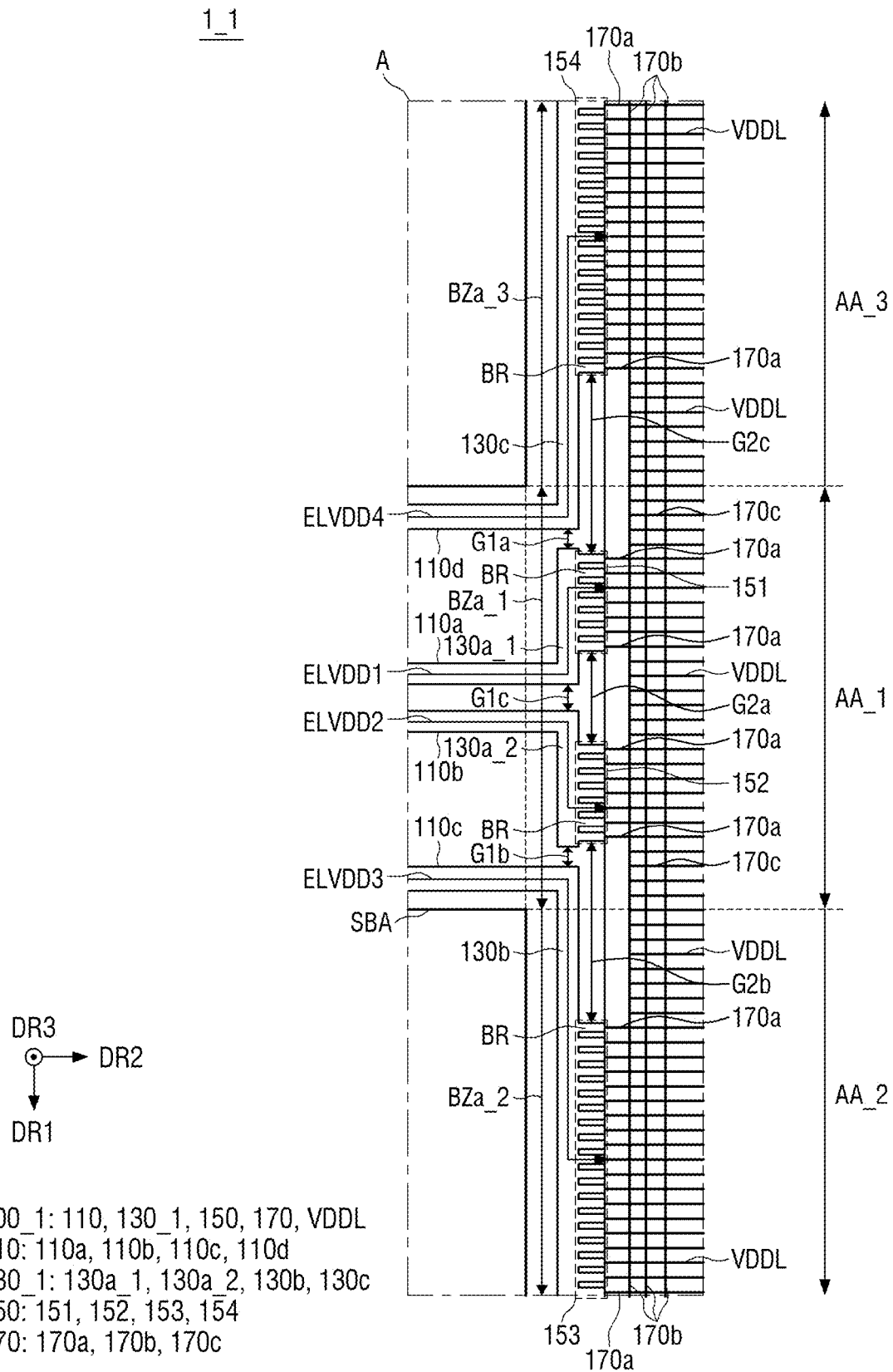
FIG. 12 is a structural view illustrating a structure of a first power supply of a display device according to some embodiments.

FIG. 12 is a structural view illustrating a structure of a first power supply of a display device according to some embodiments.

Referring to FIG. 12, in a display device 1_1 according to some embodiments, a voltage bar 130_1 connected to the first lead-in portion 110*a* and a voltage bar 130_1 connected to the second lead-in portion 110*b* may be spaced apart from each other.

The voltage bar 130_1 of a first power supply 110_1 of the display device 1_1 according to some embodiments may include a (1_1)th voltage bar 130*a*_1 connected to the first lead-in portion 110*a* and a (1_2)th voltage bar 130*a*_2, a second voltage bar 130*b* and a third voltage bar 130*c*, which are connected to the second lead-in portion 110*b*. The (1_1)th voltage bar 130*a*_1 and the (1_2)th voltage bar 130*a*_2 may be arranged to be spaced apart from each other in the first direction DR1 with a gap (e.g, a set or predetermined gap) G1*c*.

The gap G1*c* between the (1_1)th voltage bar 130*a*_1 and the (1_2)th voltage bar 130*a*_2 may be substantially the same as the gap G0 between the first lead-in portion 110*a* and the second lead-in portion 110*b*.

The (1_1)th power voltage ELVDD1 and the (1_2)th power voltage ELVDD2 may be more easily separated from each other by the above-described configuration.

Figure 13:
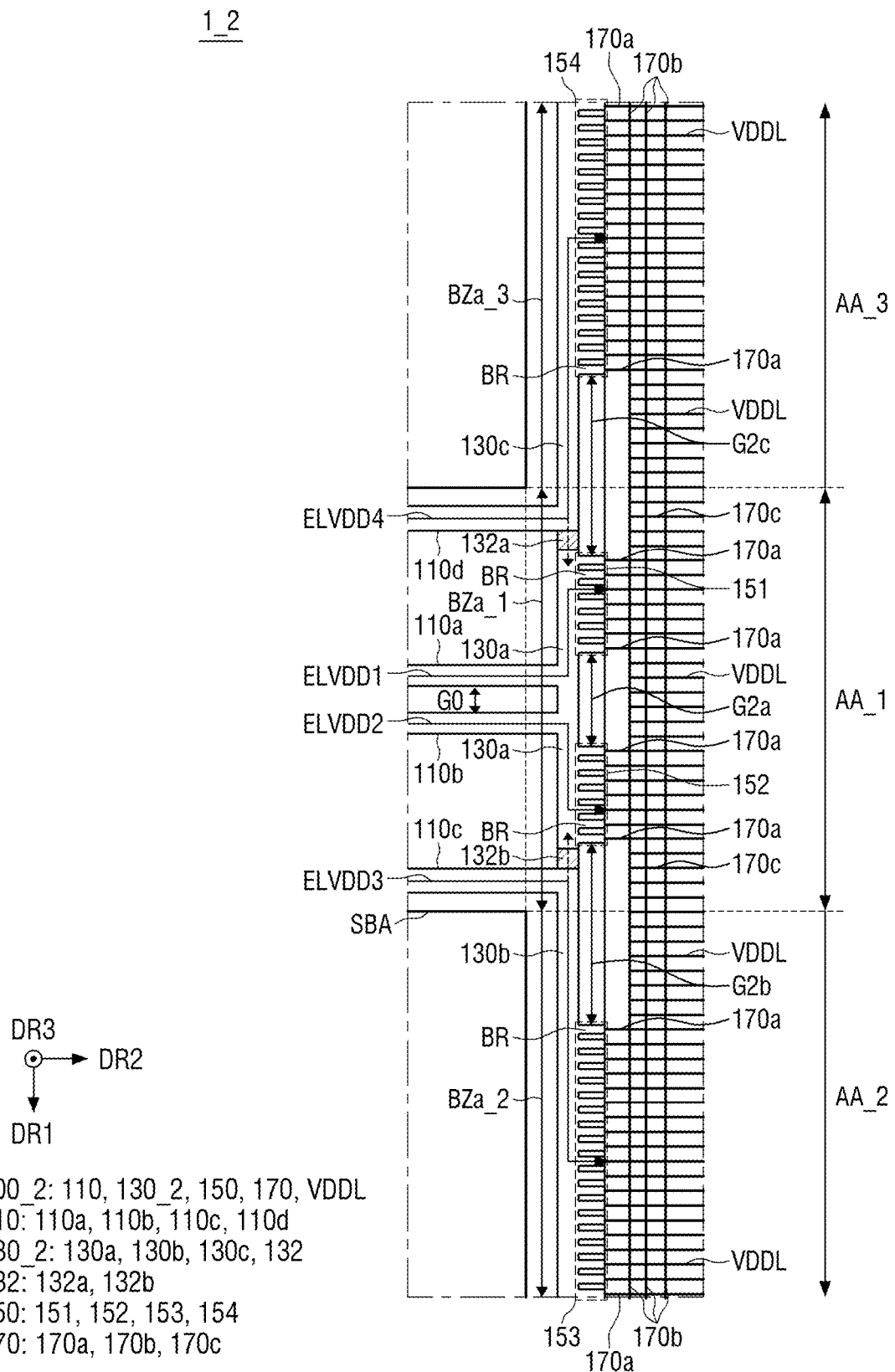
FIG. 13 is a structural view illustrating a structure of a first power supply of a display device according to some embodiments.

FIG. 13 is a structural view illustrating a structure of a first power supply of a display device according to some embodiments.

Referring to FIG. 13, in a first power supply 100_2 of a display device 1_2 according to some embodiments, a voltage bar 130_2 may further include a conducting portion 132. For example, the conducting portion 132 may electrically connect the first voltage bar 130*a*, the second voltage bar 130*b* and the third voltage bar 130*c* with one another.

According to some embodiments, the conducting portion 132 may include a first conducting portion 132*a* located in a gap space between the first voltage bar 130*a* and the third voltage bar 130*c* to electrically connect the first voltage bar 130*a* with the third voltage bar 130*c*, and a second conducting portion 132*b* located in a gap space between the first voltage bar 130*a* and the second voltage bar 130*b* to electrically connect the first voltage bar 130*a* with the second voltage bar 130*b*.

The conducting portion 132 may include a material having a resistance value relatively higher than that of each of the first voltage bar 130*a*, the second voltage bar 130*b* and the third voltage bar 130*c*. For example, the conducting portion 132 may include other material having a resistance value higher than that of a material included in the first voltage bar 130*a*, the second voltage bar 130*b*, and the third voltage bar 130*c*, or include substantially the same material as the material included in the first voltage bar 130*a*, the second voltage bar 130*b*, and the third voltage bar 130*c*, but may have a higher resistance value due to impurities added thereto.

In accordance with the above configuration, the display device according to some embodiments may relatively uniformly supply the first power voltage of uniform intensity to the active area AA depending on each area. For example, because the resistance value of the conducting portion 132 is greater than that of each of the first voltage bar 130*a*, the second voltage bar 130*b* and the third voltage bar 130*c*, a portion other than the entirety of the (1_4)th power voltage ELVDD4 may be conducted to the first voltage bar 130*a* through the first conducting portion 132*a* or a portion other than the entirety of the (1_1)th power voltage ELVDD1 may be conducted to the third voltage bar 130*c* through the first conducting portion 132*a*. Likewise, a portion other than the entirety of the (1_3)th power voltage ELVDD3 may be conducted to the first voltage bar 130*a* through the second conducting portion 132*b*, or a portion other than the entirety of the (1_2)th power voltage ELVDD2 may be conducted to the second voltage bar 130*b* through the first conducting portion 132*a*, so that the (1_1)th power voltage ELVDD1, the (1_2)th power voltage ELVDD2, the (1_3)th power voltage ELVDD3 and the (1_4)th power voltage ELVDD4 may have uniform intensity.

Figure 14:
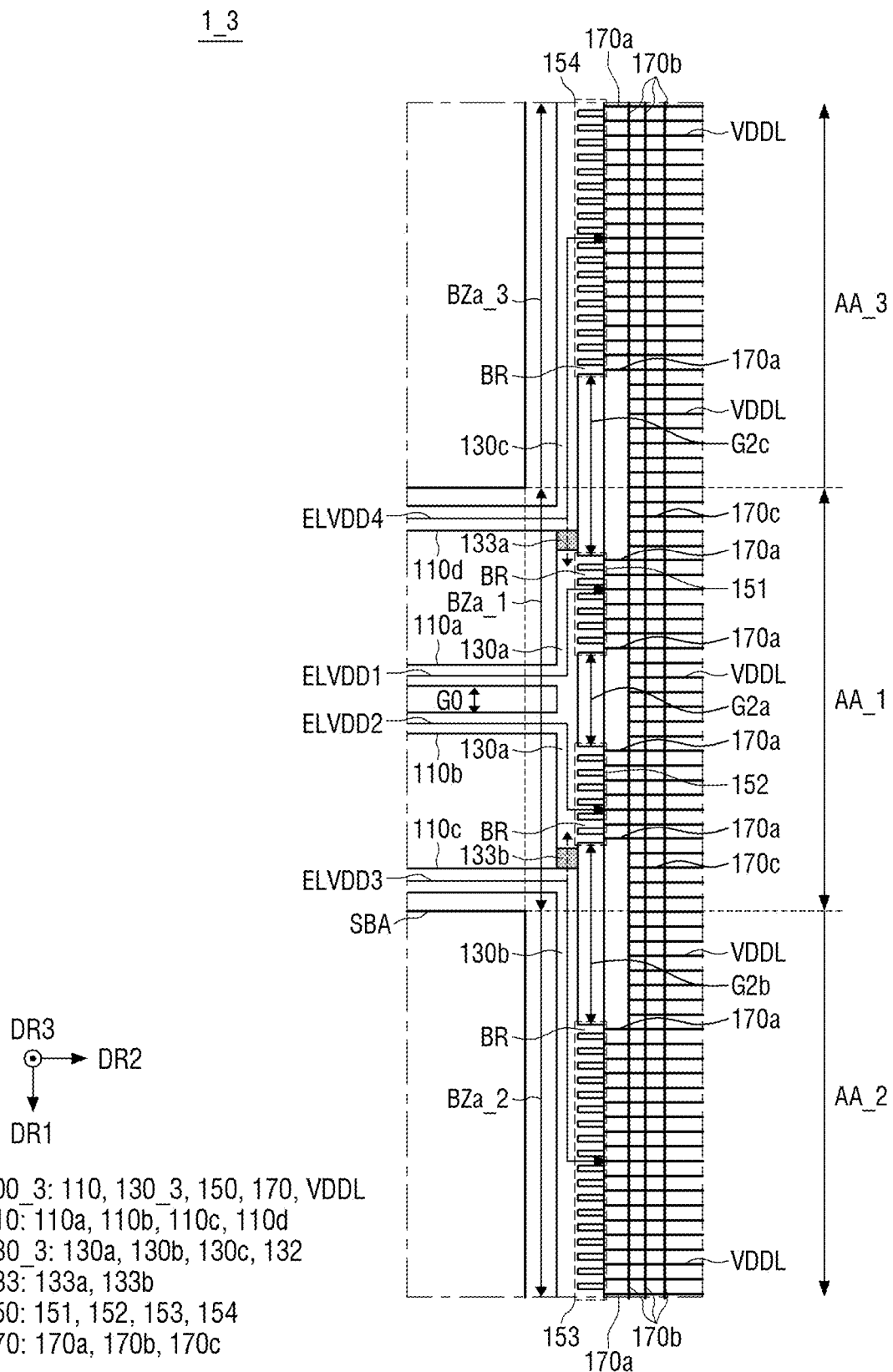
FIG. 14 is a structural view illustrating a structure of a first power supply of a display device according to some embodiments.
Figure 15:
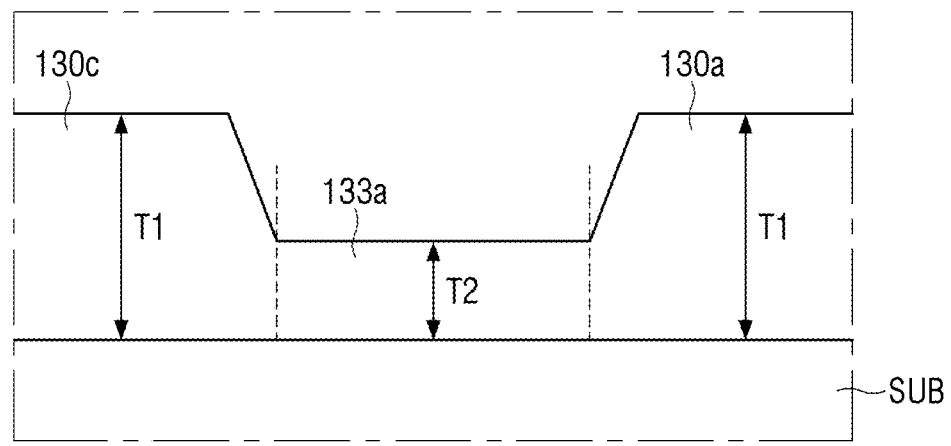
FIG. 15 is a view illustrating a thickness of a first conducting portion of a display device according to the embodiments of FIG. 14.
Figure 15:
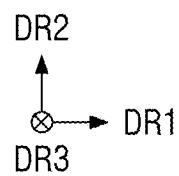

FIG. 14 is a structural view illustrating a structure of a first power supply of a display device according to some embodiments. FIG. 15 is a view illustrating a thickness of a conducting portion of a display device according to the embodiments of FIG. 14.

Referring to FIGS. 14 and 15, in a display device 1_3 according to some embodiments, a conducting portion 133 of a first power supply 100_3 includes the same material as that of the first voltage bar 130a, the second voltage bar 130b and the third voltage bar 130c in comparison with the display device 1_2 according to the embodiments of FIG. 13, but its thickness is thinner than that of the display device 1_2. In FIG. 15, only the first conducting portion 133a is illustrated for convenience of description, but the first conducting portion 133a may have substantially the same structure as that of a second conducting portion 133b.

In other words, the first voltage bar 130a, the second voltage bar 130b and the third voltage bar 130c may have substantially the same thickness T1, and a thickness T2 of the first conducting portion 133a may be thinner than the thickness T1 of each of the first voltage bar 130a, the second voltage bar 130b and the third voltage bar 130c. In addition, a thickness T2 of the second conducting portion 133b may be thinner than the thickness T1 of each of the first voltage bar 130a, the second voltage bar 130b and the third voltage bar 130c. In general, electrical resistance has a correlation in proportion as a line thickness becomes thinner. Therefore, electrical resistance of the first conducting portion 133a and the second conducting portion 133b may be greater than that of each of the first voltage bar 130a, the second voltage bar 130b and the third voltage bar 130c.

In accordance with the above configuration, the display device according to some embodiments may uniformly supply the first power voltage of uniform intensity to the active area AA depending on each area. For example, because the resistance value of the conducting portion 132 is greater than that of each of the first voltage bar 130a, the second voltage bar 130b and the third voltage bar 130c, a portion other than the entirety of the (1_4)th power voltage ELVDD4 may be conducted to the first voltage bar 130a through the first conducting portion 132a or a portion other than the entirety of the (1_1)th power voltage ELVDD1 may be conducted to the third voltage bar 130c through the first conducting portion 132a. Likewise, a portion other than the entirety of the (1_3)th power voltage ELVDD3 may be conducted to the first voltage bar 130a through the second conducting portion 132b, or a portion other than the entirety of the (1_2)th power voltage ELVDD2 may be conducted to the second voltage bar 130b through the first conducting portion 132a, so that the (1_1)th power voltage ELVDD1, the (1_2)th power voltage ELVDD2, the (1_3)th power voltage ELVDD3 and the (1_4)th power voltage ELVDD4 may have uniform intensity.

Figure 16:
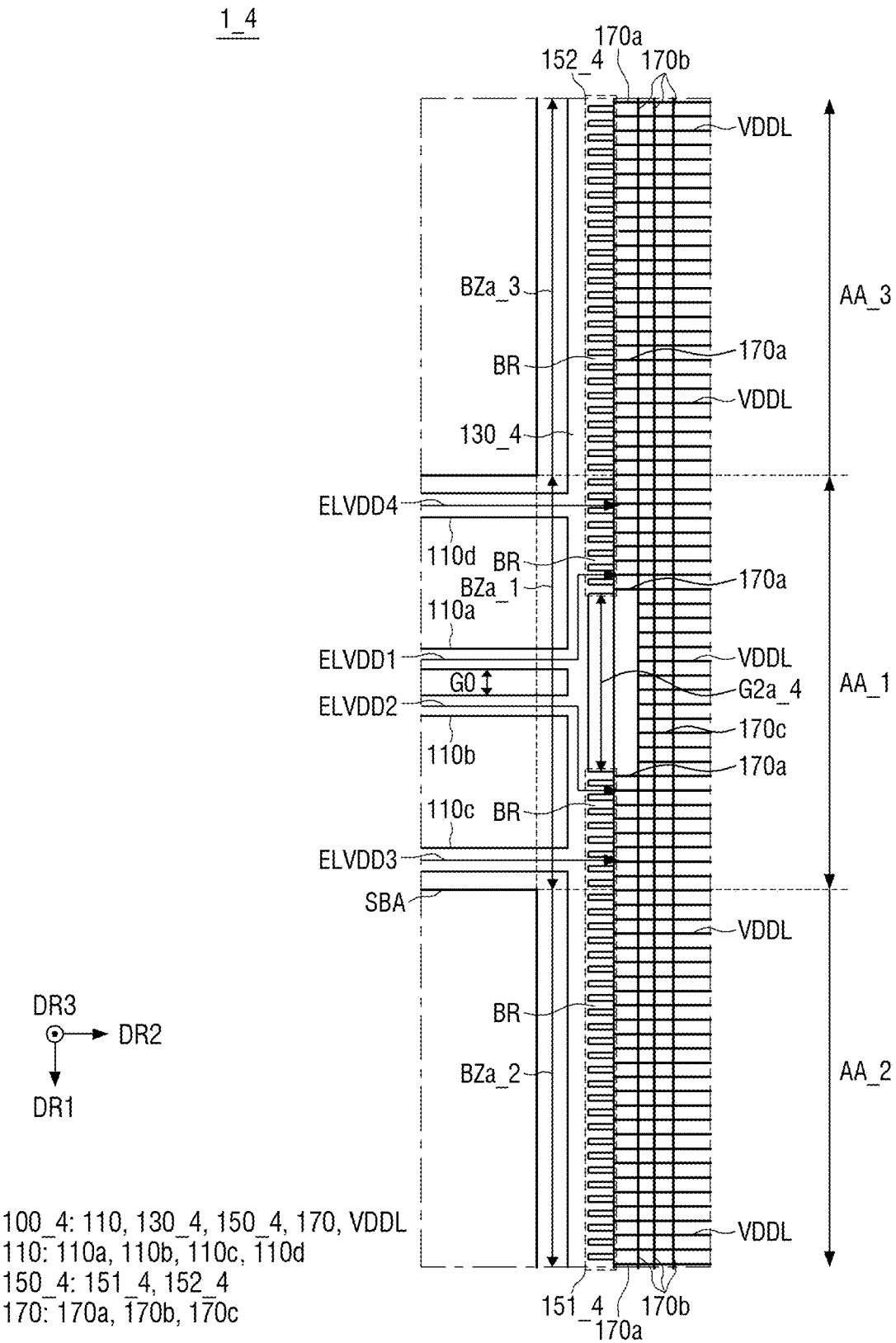
FIG. 16 is a structural view illustrating a structure of a first power supply of a display device according to some embodiments.

FIG. 16 is a structural view illustrating a structure of a first power supply of a display device according to some embodiments.

Referring to FIG. 16, in a first power supply 100_4 of a display device 1_4, a voltage bar 130_4 is integrally extended without being separated, and a bridge part 150_4 protruded from the voltage bar 130_4 may be spaced apart from the first portion BZa_1 of the first bezel area BZa in the first direction DR1.

For example, the voltage bar 130_4 according to some embodiments may be extended in the first direction DR1 along the first bezel area BZa without a portion that is disconnected, and the bridge part 150_4 may include a second bridge part 152_4 overlapped with a portion of the other side of the first active area AA_1 in the first direction DR1 and the third active area AA_3, and a first bridge part 151_4 overlapped with a portion of one side of the first active area AA_1 in the first direction DR1 and the second active area AA_2.

The first bridge part 151_4 and the second bridge part 152_4 may be spaced apart from each other in the first direction DR1 with a gap (e.g., a set or predetermined gap) G2a_4. The gap G2a_4 between the first bridge part 151_4 and the second bridge part 152_4 may be greater than the gap G0 between the first lead-in portion 110a and the second lead-in portion 110b. In other words, the first lead-in portion 110a and the second lead-in portion 110b may overlap the gap space between the first bridge part 151_4 and the second bridge part 152_4 in the second direction DR2. In other words, the gap space between the first bridge part 151_4 and the second bridge part 152_4 may be located on the first portion BZa_1 of the first bezel area BZa, and may overlap the first active area AA_1 in the second direction DR2. In other words, the gap space between the first bridge part 151_4 and the second bridge part 152_4 may overlap the central portion of the first active area AA_1 in the second direction DR2.

In accordance with the above configuration, the voltage bar 130_4 according to some embodiments may include an insulating portion electrically insulated from the mesh portion 170 because the bridge part 150_4 is not located, a first conducting portion electrically connected to the mesh portion 170 by the first bridge part 151_4, and a second conducting portion electrically connected to the mesh portion 170 by the second bridge part 152_4. Therefore, the (1_1)th power voltage ELVDD1 is not conducted to the mesh portion 170 through a path straight to the second direction DR2 but conducted to the mesh portion 170 through a path toward the second bridge part 152_4 after being bent in the first direction DR1. The (1_2)th power voltage ELVDD2 is not conducted to the mesh portion 170 through a path straight to the second direction DR2 but conducted to the mesh portion 170 through a path toward the first bridge part 151_4 after being bent in the first direction DR1. As a result, the first power voltage may be prevented from being concentrated on the central portion of the first active area AA_1.

In addition, because the voltage bar 130_4 is extended in the first direction DR1 without being disconnected, the process of manufacturing the voltage bar 130_4 may be further simplified, and thus process performance may be improved.

In concluding the detailed description, those skilled in the art will appreciate that many variations and modifications can be made to the example embodiments without substantially departing from the principles of embodiments according to the present invention. Therefore, the disclosed example embodiments of the invention are used in a generic and descriptive sense only and not for purposes of limitation.

What is claimed is:
1. A display device comprising:
a display panel including an active area configured to be slid in a first direction and a non-active area surrounding the active area;
a plurality of pixels in the active area; and
a first power supply configured to transfer a first power voltage to drive the plurality of pixels, wherein the active area includes:
a first active area; and
a second active area on one side of the first active area in the first direction and configured to be slid in the first direction,
the first power supply includes:
a first voltage bar on one side of the first active area in the non-active area in a second direction crossing the first direction;
a second voltage bar spaced apart from one end of the first voltage bar in the first direction and on one side of the second active area in the non-active area in the second direction.

2. The display device of claim 1, wherein the display panel further includes a sub-area protruding from the non-active area to one side in the second direction, overlapping with the first active area in the second direction and not overlapping with the second active area in the second direction, and
the first power supply further includes a first power lead-in portion in the sub-area to apply the first power voltage to the first voltage bar and the second voltage bar.

3. The display device of claim 2, wherein the first power supply includes:
a first bridge part protruding from the other side of the first voltage bar in the first direction toward the first active area;
a second bridge part protruding from one side of the first voltage bar in the first direction toward the first active area and spaced apart from the first bridge part; and
a third bridge part protruding from the second voltage bar toward the second active area and spaced apart from the second bridge part.

4. The display device of claim 3, wherein a width of a gap space between the second bridge part and the third bridge part is greater than a width of a gap space between the first voltage bar and the second voltage bar.

5. The display device of claim 4, wherein the first power lead-in portion includes:
a first lead-in portion electrically connected to the first voltage bar; and
a second lead-in portion electrically connected to the first voltage bar and spaced apart from the first lead-in portion, and
a width of a gap space between the first bridge part and the second bridge part is greater than a width of a gap space between the first lead-in portion and the second lead-in portion.

6. The display device of claim 5, wherein the first lead-in portion is closer to the first bridge part than the second bridge part, and
the second lead-in portion is closer to the second bridge part than the first bridge part.

7. The display device of claim 5, wherein each of the first bridge part, the second bridge part and the third bridge part includes a plurality of bridges, and
the plurality of bridges respectively extend in the second direction, and are spaced apart from each other in the first direction.

8. The display device of claim 7, wherein the first power supply further includes:
a plurality of first power voltage lines extending in the second direction within the active area and spaced apart from each other in the first direction; and a mesh portion at the first bridge part, the second bridge part, and the third bridge part and the plurality of first power voltage lines to have a grid pattern, and
the mesh portion electrically connects the first bridge part, the second bridge part and the third bridge part and the plurality of first power voltage lines.

9. The display device of claim 8, wherein each of the plurality of first power voltage lines is electrically connected to each of the plurality of pixels.

10. The display device of claim 1, further comprising a second power supply spaced apart from the first power supply and extending from the non-active area along an edge of the active area, and configured to transfer a second power voltage for driving the plurality of pixels,
wherein the first power voltage has a potential greater than that of the second power voltage.

11. The display device of claim 1, wherein the active area further includes a third active area on the other side of the first active area in the first direction and configured to be slid in the first direction, and
the first power supply further includes a third voltage bar spaced apart from the other end of the first voltage bar in the first direction and on one side of the third active area in the non-active area in the second direction.

12. The display device of claim 1, wherein the first power supply further includes a first conducting portion in a gap space between the first voltage bar and the second voltage bar to electrically connect the first voltage bar with the second voltage bar, and
electrical resistance of the first conducting portion is greater than electrical resistance of the first voltage bar and electrical resistance of the second voltage bar.

13. The display device of claim 12, wherein a thickness of the first conducting portion is smaller than a thickness of the first voltage bar and a thickness of the second voltage bar.

14. A display device comprising:
a display panel including an active area configured to be slid in a first direction and a non-active area surrounding the active area;
a plurality of pixels in the active area; and
a first power supply configured to transfer a first power voltage to drive the plurality of pixels,
the active area includes:
a first active area;
a second active area on one side of the first active area in the first direction and slid in the first direction,
the first power supply includes:
a voltage bar on one side of the active area in the non-active area in a second direction crossing the first direction and overlapped with the first active area and the second active area in the second direction as a single body extending in the first direction; and
a first bridge part and a second bridge part, which protrude from the voltage bar in the second direction and are spaced apart from each other in the first direction, and
a gap space between the first bridge part and the second bridge part overlaps the first active area in the second direction.

15. The display device of claim 14, wherein the display panel further includes a sub-area protruding from the non-active area to one side in the second direction, overlapping with the first active area in the second direction and not overlapping with the second active area in the second direction, and
the first power supply further includes a first power lead-in portion in the sub-area to apply the first power voltage to the voltage bar.

16. The display device of claim 15, wherein the first bridge part overlaps the first active area and the second active area in the second direction, and the second bridge part overlaps the first active area in the second direction and does not overlap the second active area in the second direction.

17. The display device of claim 16, wherein each of the first bridge part and the second bridge part includes a plurality of bridges, and the plurality of bridges extend in the second direction and are spaced apart from each other in the first direction.

18. The display device of claim 17, wherein the first power lead-in portion includes a first lead-in portion, a second lead-in portion, a third lead-in portion, and a fourth lead-in portion, which are spaced apart from one another, the first lead-in portion and the second lead-in portion overlap the gap space between the first bridge part and the second bridge part in the second direction, the third lead-in portion overlaps the first bridge part in the second direction, and the fourth lead-in portion overlaps the second bridge part in the second direction.

19. The display device of claim 18, further comprising a first driving chip and a second driving chip, configured to generate a data signal to drive the plurality of pixels, the first driving chip and the second driving chip are spaced apart from each other in the sub-area, the first driving chip is in a gap space between the first lead-in portion and the fourth lead-in portion, and the second driving chip is in a gap space between the second lead-in portion and the third lead-in portion.

20. The display device of claim 15, further comprising a panel support on the other surface facing one surface of the display panel to support the display panel, wherein the plurality of pixels and the first power supply are on one surface of the display panel.

21. The display device of claim 20, wherein the active area further includes a third active area on the other side of the first active area in the first direction and configured to be slid in the first direction, not overlapping with the sub-area in the second direction and overlapping with the second bridge part in the second direction, the panel support includes:

a plate overlapping with the first active area; and a plurality of segments not overlapping with the first active area and overlapping with the second active area and the third active area, and the plurality of segments respectively extend in the second direction, and are spaced apart from each other in the first direction.

22. The display device of claim 21, wherein a thickness of the plate is smaller than that of each of the plurality of segments, and an air gap is on a bottom surface of the plate.

23. A display panel comprising:

an active area including a first active area, a second active area on one side of the first active area in a first direction and configured to be slid in the first direction, and a third active area on the other side of the first active area in the first direction and configured to be slid in the first direction;

a non-active area surrounding the active area; and a power supply on one side of the active area on the non-active area in a second direction crossing the first direction, the power supply includes:

a voltage bar extending in the first direction; and a first bridge part and a second bridge part, which protrude from the voltage bar in the second direction and are spaced apart from each other in the first direction, and a gap space between the first bridge part and the second bridge part overlaps the first active area in the second direction.

24. The display panel of claim 23, wherein the voltage bar includes:

a first voltage bar on one side of the first active area in the second direction;

a second voltage bar spaced apart from one end of the first voltage bar in the first direction and on one side of the second active area in the second direction; and a third voltage bar spaced apart from the other end of the first voltage bar in the first direction and on one side of the third active area in the second direction.

25. The display panel of claim 23, wherein the voltage bar overlaps the first to third active areas in the second direction as a single body extending in the first direction.

* * * * *